United States Patent
Rogers

(10) Patent No.: US 11,673,275 B2
(45) Date of Patent: Jun. 13, 2023

(54) THROUGH-BEAM AUTO TEACHING

(71) Applicants: Yaskawa America, Inc., Waukegan, IL (US); KABUSHIKI KAISHA YASKAWA DENKI, Kitakyushu (JP)

(72) Inventor: John Charles Rogers, Danville, CA (US)

(73) Assignees: YASKAWA AMERICA, INC., Waukegan, IL (US); KABUSHIKI KAISHA YASKAWA DENKI, Kitakyushu (JP)

( * ) Notice: Subject to any disclaimer, the term of this patent is extended or adjusted under 35 U.S.C. 154(b) by 374 days.

(21) Appl. No.: 16/784,193

(22) Filed: Feb. 6, 2020

(65) Prior Publication Data

US 2020/0254625 A1     Aug. 13, 2020

Related U.S. Application Data

(60) Provisional application No. 62/802,759, filed on Feb. 8, 2019.

(51) Int. Cl.
*B25J 13/08* (2006.01)
*B25J 9/16* (2006.01)
(Continued)

(52) U.S. Cl.
CPC ............. *B25J 13/089* (2013.01); *B25J 9/042* (2013.01); *B25J 9/1664* (2013.01); *B25J 9/1692* (2013.01); *B25J 19/021* (2013.01); *G05B 19/18* (2013.01)

(58) Field of Classification Search
CPC ...................................................... B25J 9/042
See application file for complete search history.

(56) References Cited

U.S. PATENT DOCUMENTS

| 4,825,808 A | 5/1989 | Takahashi et al. |
| 5,695,564 A | 12/1997 | Imahashi |

(Continued)

FOREIGN PATENT DOCUMENTS

| EP | 0996963 A1 | 1/1999 |
| EP | 1137052 B1 | 9/2001 |

(Continued)

OTHER PUBLICATIONS

International Search Report and Written Opinion of the International Searching Authority for corresponding International Application No. PCT/US20/17097, dated May 27, 2020.

(Continued)

*Primary Examiner* — Jeff A Burke
*Assistant Examiner* — Christopher A Buksa
(74) *Attorney, Agent, or Firm* — Mori & Ward, LLP

(57) ABSTRACT

A method of teaching a robot including providing a pin at a location within a work station, and the robot in an area adjacent to the station. The robot having an arm and an end effector that pivots. The end effector has a through-beam sensor including a light emitter and a light receiver to sense when an object is present therebetween. The robot is moved to perform sensing operations in which the sensor senses the pin, such operations are performed while a position and/or an orientation of the end effector are varied to gather sensed position and orientation data. The sensing operations are performed such that the pin is located at different distances between the emitter and the receiver as the robot moves the sensor across the pin. Calculations are performed on the data to determine the location of the pin with respect to a coordinate system of the robot.

35 Claims, 22 Drawing Sheets

(51) Int. Cl.
  *G05B 19/18*   (2006.01)
  *B25J 19/02*   (2006.01)
  *B25J 9/04*    (2006.01)

(56) References Cited

U.S. PATENT DOCUMENTS

| | | | |
|---|---|---|---|
| 5,783,834 | A | 7/1998 | Shatas |
| 5,788,447 | A | 8/1998 | Yonemitsu et al. |
| 5,882,165 | A | 3/1999 | Maydan et al. |
| 6,038,029 | A | 3/2000 | Finarov |
| 6,070,109 | A | 5/2000 | McGee et al. |
| 6,195,619 | B1 | 2/2001 | Ren |
| 6,198,976 | B1 | 3/2001 | Sundar et al. |
| 6,256,555 | B1 | 7/2001 | Bacchi et al. |
| 6,275,748 | B1 | 8/2001 | Bacchi et al. |
| 6,366,830 | B2 | 4/2002 | Bacchi et al. |
| 6,430,472 | B1 | 8/2002 | Boillot et al. |
| 6,438,449 | B2 | 8/2002 | Kawamatsu et al. |
| 6,438,460 | B1 | 8/2002 | Bacchi et al. |
| 6,453,214 | B1 | 9/2002 | Bacchi et al. |
| 6,519,860 | B1 | 2/2003 | Bieg et al. |
| 6,591,160 | B2 | 7/2003 | Hine et al. |
| 6,618,645 | B2 | 9/2003 | Bacchi et al. |
| 6,668,466 | B1 | 12/2003 | Bieg et al. |
| 6,852,194 | B2 | 2/2005 | Matsushita et al. |
| 6,898,487 | B2 | 5/2005 | Bacchi et al. |
| 6,934,606 | B1 | 8/2005 | Genetti et al. |
| 6,962,471 | B2 | 11/2005 | Birkner et al. |
| 6,996,456 | B2 | 2/2006 | Cordell et al. |
| 7,015,418 | B2 | 3/2006 | Cahill et al. |
| 7,039,498 | B2 | 5/2006 | Bacchi et al. |
| 7,090,741 | B2 | 8/2006 | Narushima et al. |
| 7,151,591 | B2 | 12/2006 | Bijvoet |
| 7,205,742 | B2 | 4/2007 | Adachi et al. |
| 7,233,842 | B2 | 6/2007 | Bacchi et al. |
| 7,453,160 | B2 | 11/2008 | Ray |
| 7,522,267 | B2 | 4/2009 | Hofmeister et al. |
| 7,706,919 | B2 | 4/2010 | Adachi et al. |
| 7,976,263 | B2 | 7/2011 | Barker et al. |
| 8,029,225 | B2 | 10/2011 | van der Meulen |
| 8,112,177 | B2 | 2/2012 | Adachi et al. |
| 8,500,388 | B2 | 8/2013 | van der Meulen et al. |
| 8,934,706 | B2 | 1/2015 | Kiley et al. |
| 8,958,911 | B2 | 2/2015 | Wong et al. |
| 9,265,583 | B2 | 2/2016 | Jensen |
| 9,310,791 | B2 | 4/2016 | Chhatpar et al. |
| 9,352,466 | B2 | 5/2016 | Liao et al. |
| 9,463,574 | B2 | 10/2016 | Purkayastha et al. |
| 9,665,182 | B2 | 5/2017 | Send et al. |
| 9,728,436 | B2 | 8/2017 | Tabrizi et al. |
| 9,731,392 | B2 | 8/2017 | Takla et al. |
| 9,796,086 | B2 * | 10/2017 | Nakaya ............... B25J 9/163 |
| 9,964,398 | B2 | 5/2018 | Becker et al. |
| 10,002,781 | B2 | 6/2018 | Moura et al. |
| 10,118,297 | B2 | 11/2018 | Greer |
| 10,136,879 | B2 | 11/2018 | Ross et al. |
| 10,136,948 | B2 | 11/2018 | Jensen |
| 10,239,707 | B2 | 3/2019 | Caveney |
| 10,292,768 | B2 | 5/2019 | Lang |
| 10,381,252 | B2 | 8/2019 | Moura et al. |
| 10,974,388 | B2 | 4/2021 | Yoshida et al. |
| 11,059,178 | B2 | 7/2021 | Yoshida et al. |
| 2002/0068992 | A1 | 6/2002 | Hine et al. |
| 2003/0209097 | A1 | 11/2003 | Hunter |
| 2004/0144760 | A1 | 7/2004 | Cahill et al. |
| 2004/0227924 | A1 | 11/2004 | Willems Van Dijk et al. |
| 2005/0034288 | A1 | 2/2005 | Adachi et al. |
| 2005/0205781 | A1 | 9/2005 | Kimba |
| 2005/0283275 | A1 | 12/2005 | Tokutake et al. |
| 2006/0192514 | A1 | 8/2006 | Adachi et al. |
| 2007/0065144 | A1 | 3/2007 | Hofmeister et al. |
| 2007/0273892 | A1 | 11/2007 | Asari et al. |
| 2008/0004746 | A1 * | 1/2008 | Jahnke ............... H05K 13/0419 |
| | | | 700/229 |
| 2009/0248041 | A1 | 10/2009 | Williams et al. |
| 2009/0266194 | A1 * | 10/2009 | Zhang .................. B25J 9/104 |
| | | | 901/19 |
| 2011/0130864 | A1 * | 6/2011 | Hirota ............ H01L 21/68707 |
| | | | 901/3 |
| 2012/0017507 | A1 | 1/2012 | Owens, Jr. |
| 2012/0101633 | A1 | 4/2012 | Rodnick |
| 2013/0041509 | A1 * | 2/2013 | Saito .................... B25J 9/042 |
| | | | 700/245 |
| 2014/0207282 | A1 | 7/2014 | Angle et al. |
| 2014/0316564 | A1 | 10/2014 | Nakamura et al. |
| 2015/0221534 | A1 | 8/2015 | van der Meulen |
| 2015/0290795 | A1 | 10/2015 | Oleynik |
| 2015/0370246 | A1 | 12/2015 | Yuk et al. |
| 2016/0318182 | A1 | 11/2016 | Nakaya et al. |
| 2017/0028546 | A1 * | 2/2017 | Wilkas ............. H01L 21/67742 |
| 2017/0121113 | A1 | 5/2017 | Wagner et al. |
| 2018/0001475 | A1 | 1/2018 | Steinle et al. |
| 2018/0017679 | A1 | 1/2018 | Valouch et al. |
| 2018/0055578 | A1 | 3/2018 | Richmond et al. |
| 2018/0085175 | A1 | 3/2018 | Steinle et al. |
| 2018/0101166 | A1 | 4/2018 | Aldridge et al. |
| 2018/0136319 | A1 | 5/2018 | Send et al. |
| 2018/0290297 | A1 | 10/2018 | Brumberger |
| 2018/0329024 | A1 | 11/2018 | Send et al. |
| 2018/0360456 | A1 | 12/2018 | Shelton, IV et al. |
| 2018/0361584 | A1 | 12/2018 | Williams et al. |
| 2018/0364045 | A1 | 12/2018 | Williams et al. |
| 2019/0027389 | A1 | 1/2019 | Moura et al. |
| 2019/0053862 | A1 | 2/2019 | Ecke et al. |
| 2019/0094017 | A1 | 3/2019 | Wakabayashi et al. |
| 2019/0125461 | A1 | 5/2019 | Zheng et al. |
| 2019/0129035 | A1 | 5/2019 | Valouch et al. |
| 2019/0129036 | A1 | 5/2019 | Valouch et al. |
| 2019/0170849 | A1 | 6/2019 | Hermes et al. |
| 2019/0172964 | A1 | 6/2019 | Hermes et al. |
| 2019/0175272 | A1 | 6/2019 | Khan et al. |
| 2019/0218041 | A1 | 7/2019 | Caveney |
| 2019/0244536 | A1 | 8/2019 | Tan et al. |
| 2019/0371641 | A1 | 12/2019 | Moura et al. |

FOREIGN PATENT DOCUMENTS

| | | | | |
|---|---|---|---|---|
| EP | 1606837 | B1 | 12/2005 | |
| JP | 2003-203965 | A | 7/2003 | |
| JP | 2004-241730 | | 8/2004 | |
| JP | 2005-310858 | A | 11/2005 | |
| JP | 2010-284728 | A | 12/2010 | |
| JP | 2015-153809 | A | 8/2015 | |
| WO | WO-9946723 | A1 * | 9/1999 | ........... B25J 9/1692 |
| WO | WO 03/022534 | A1 | 3/2003 | |
| WO | WO 2005/036635 | A1 | 4/2005 | |
| WO | WO 2005/037495 | A1 | 4/2005 | |

OTHER PUBLICATIONS

Brusen et al., "Automated Production of Air to Air Heat Exchangers" Jul. 2017, Uppsala Universitet, Uppsala, Sweden.
International Preliminary Report on Patentability for corresponding International Application No. PCT/US20/17097, dated Aug. 19, 2021.
Extended European Search Report for corresponding EP Application No. 20753062.7, dated Sep. 27, 2022.
Search Report for the corresponding Singapore Patent Application No. 11202108522T, dated Mar. 21, 2023.
Written Opinion for the corresponding Singapore Patent Application No. 11202108522T, dated Mar. 24, 2023.

* cited by examiner

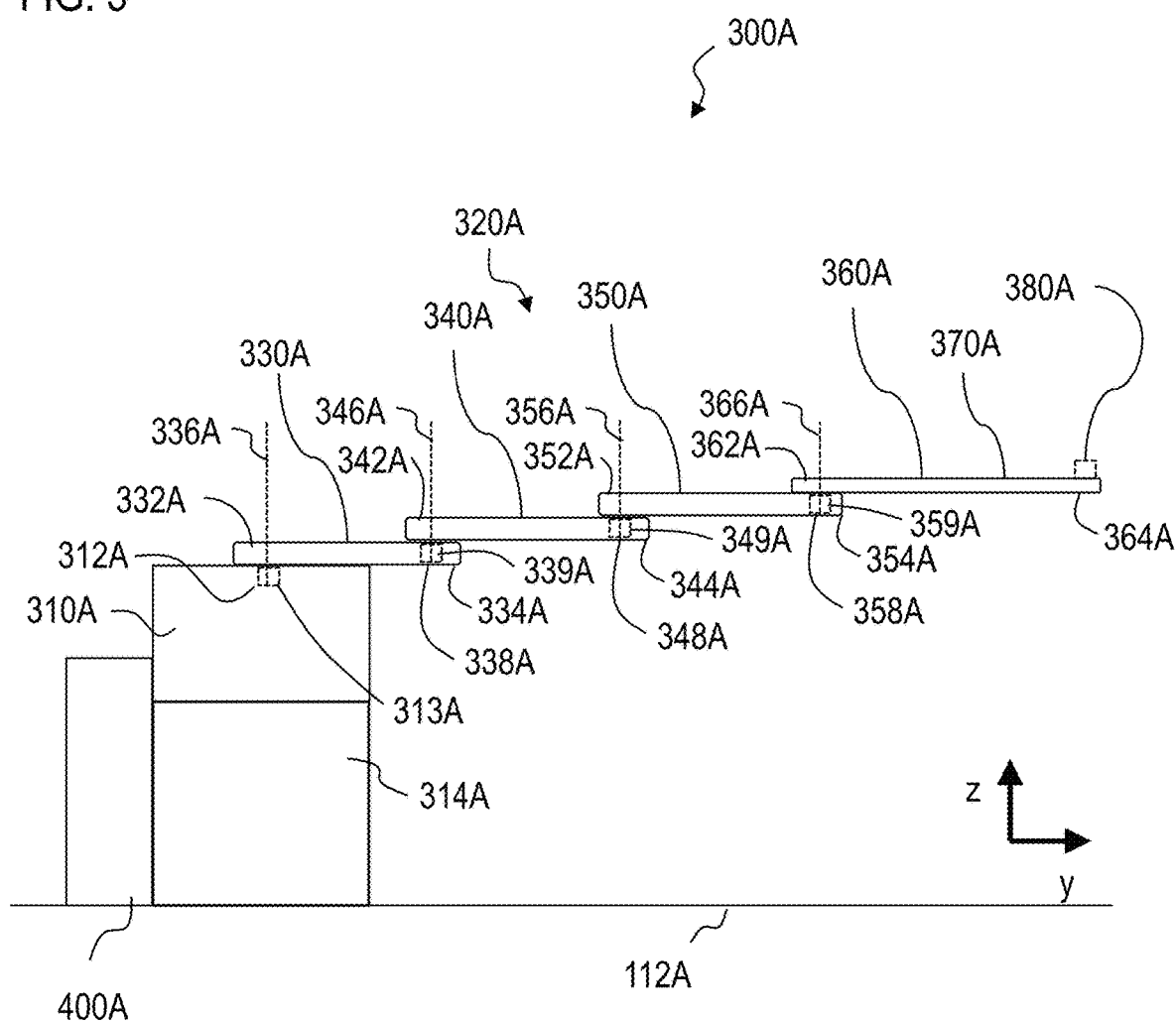

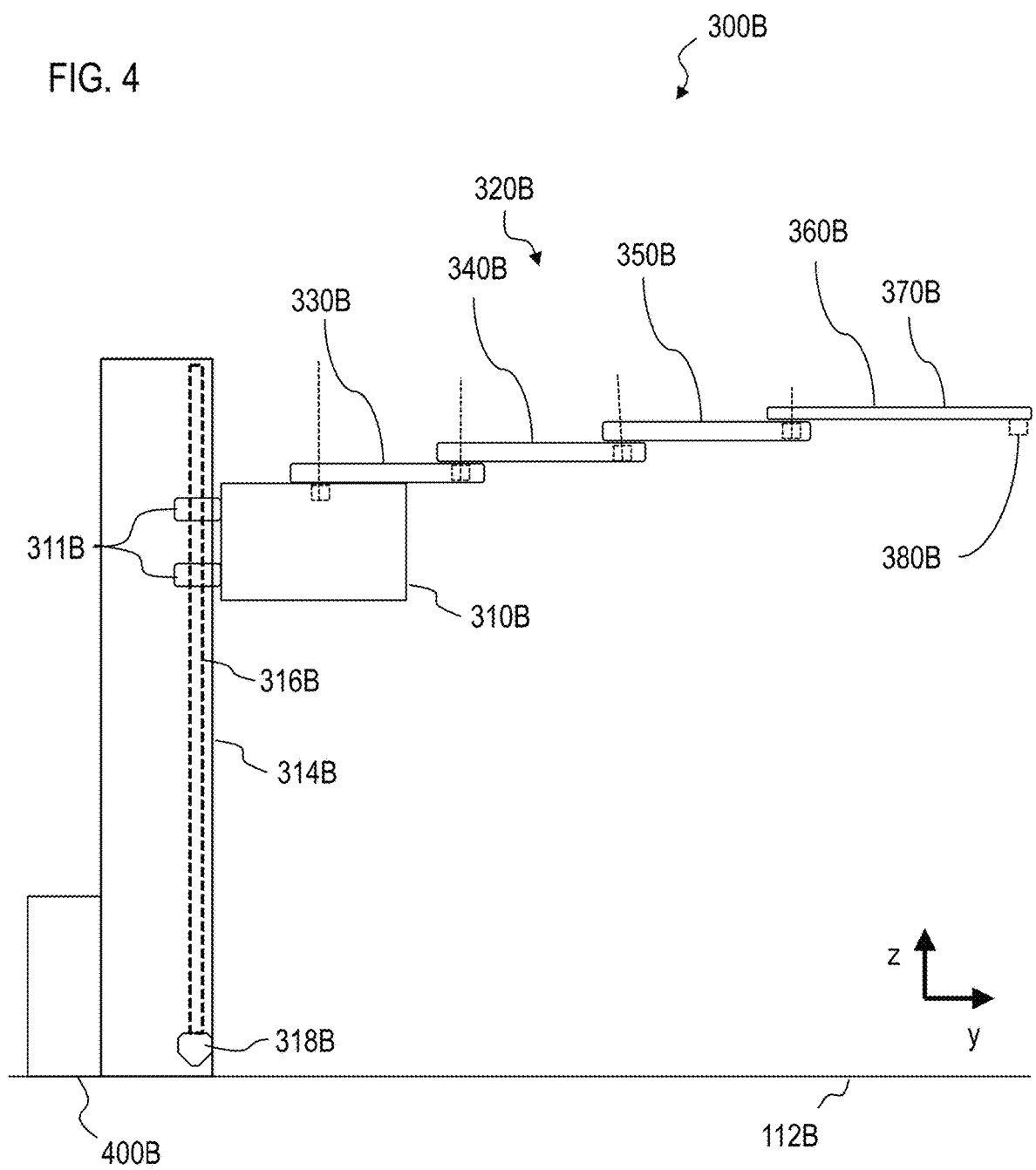

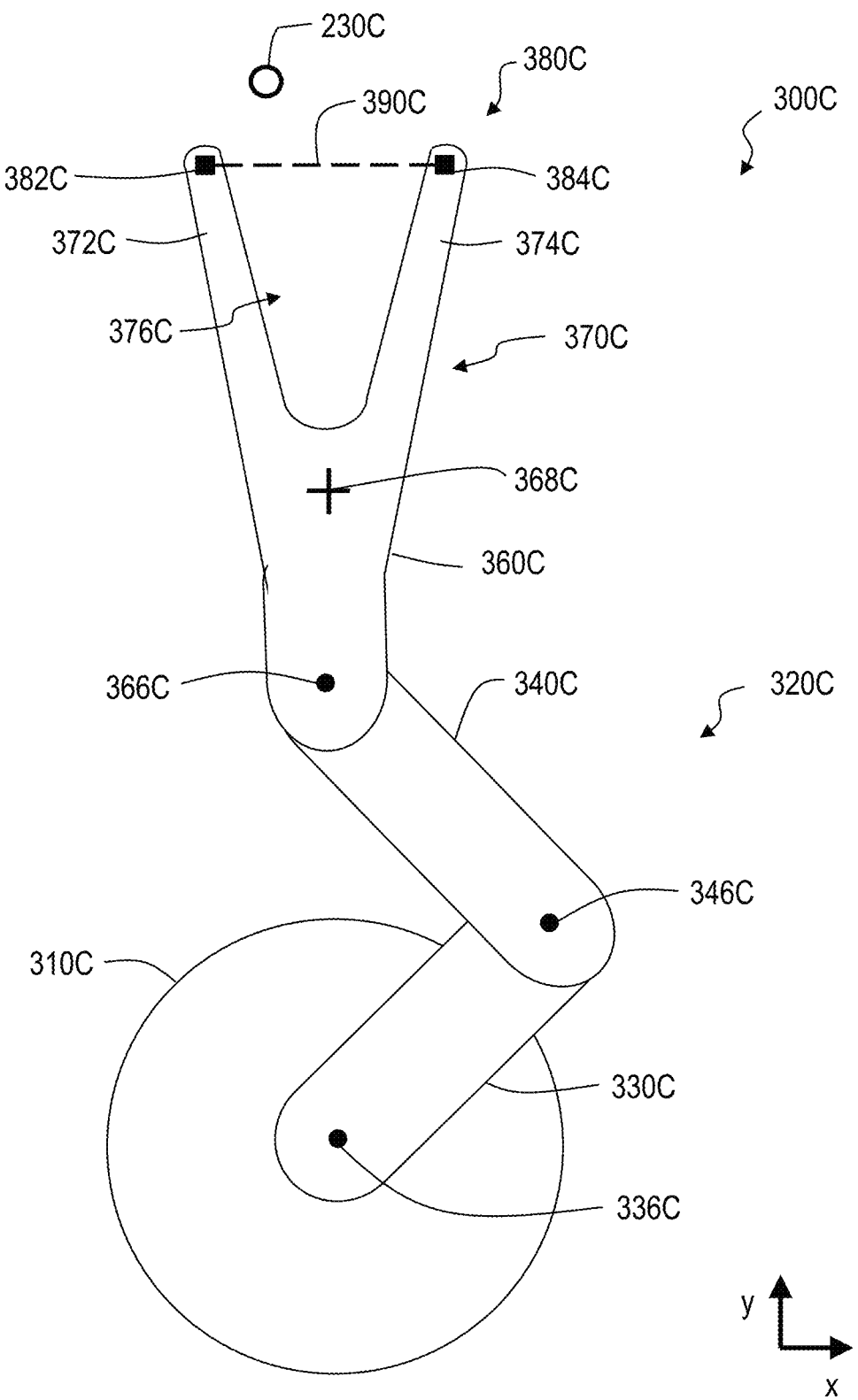

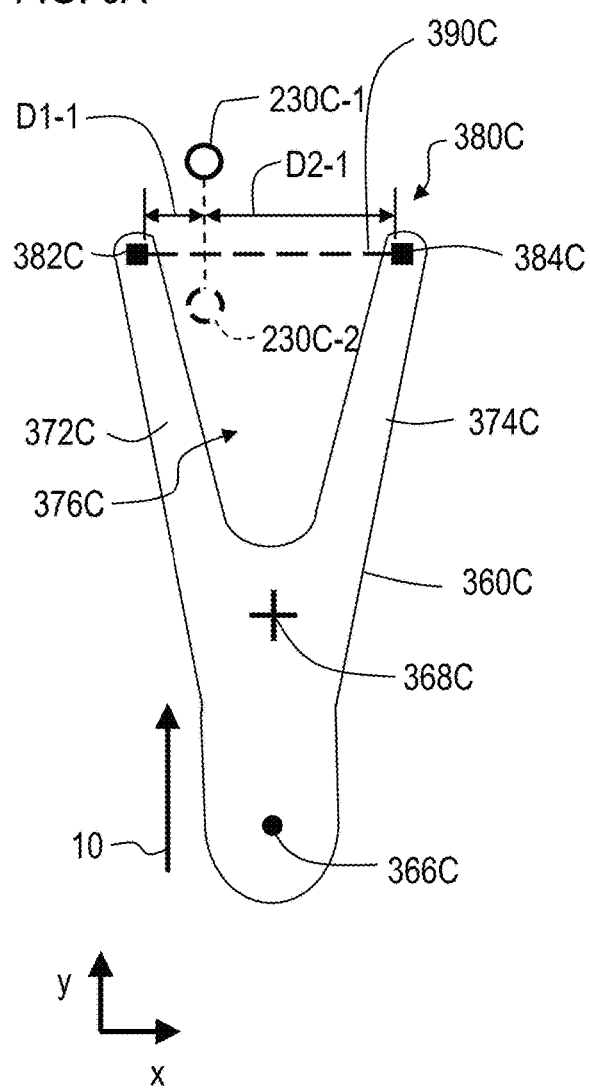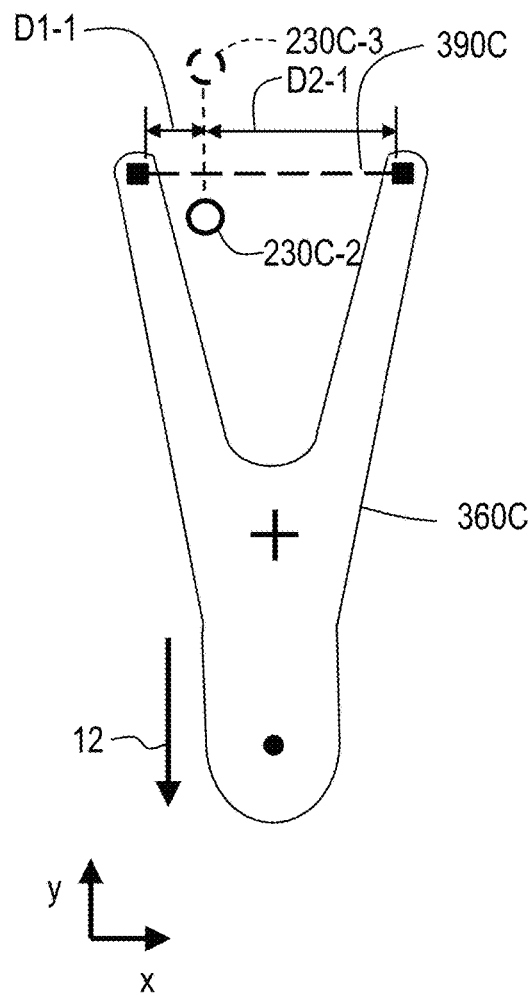

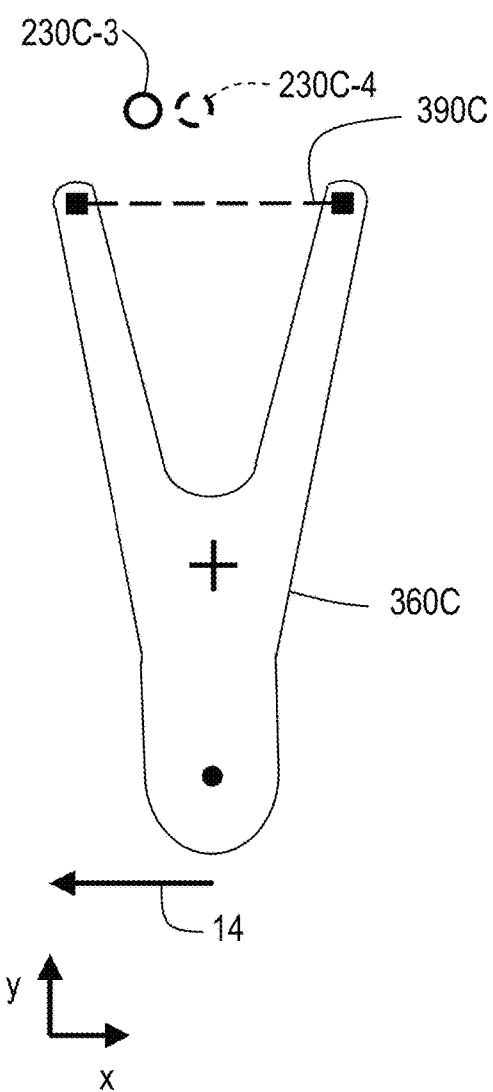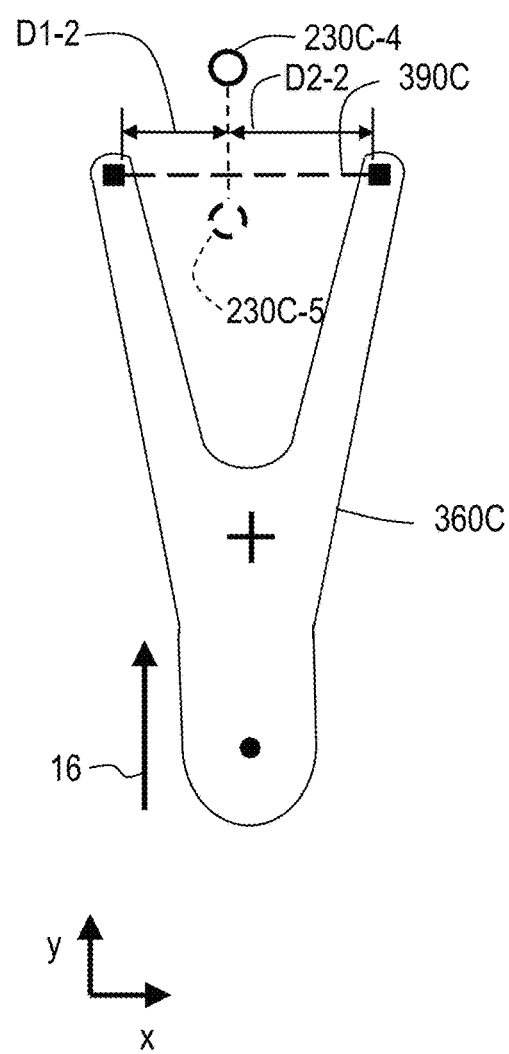

FIG. 6G
FIG. 6H
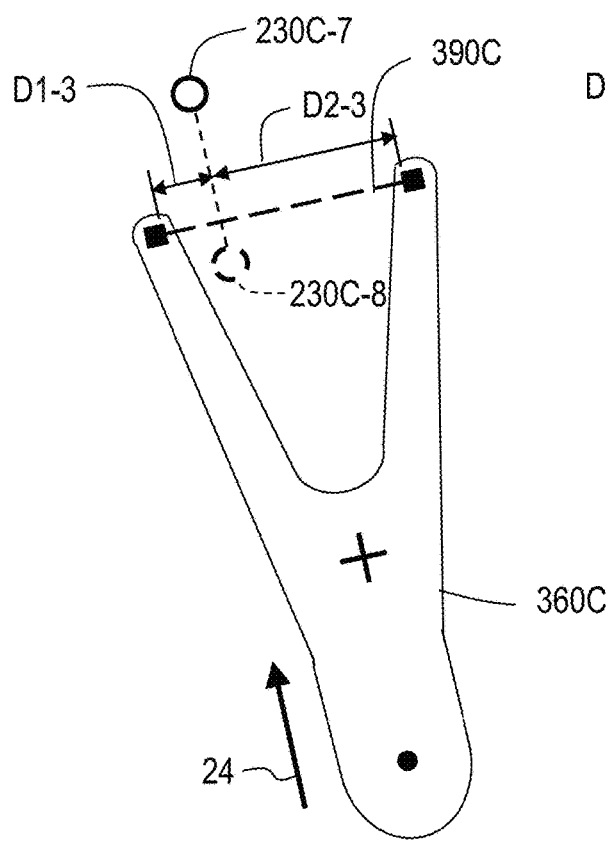
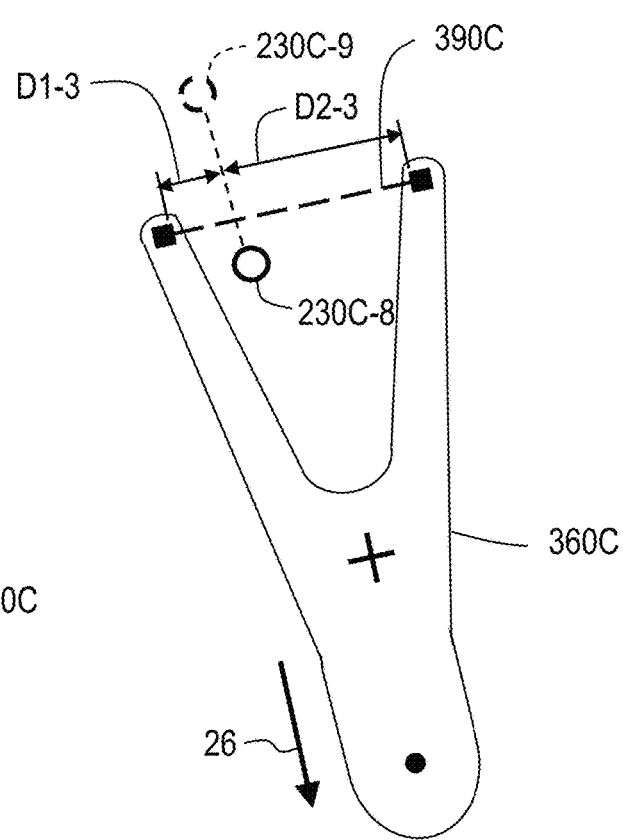
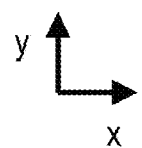
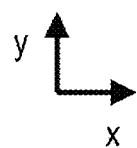

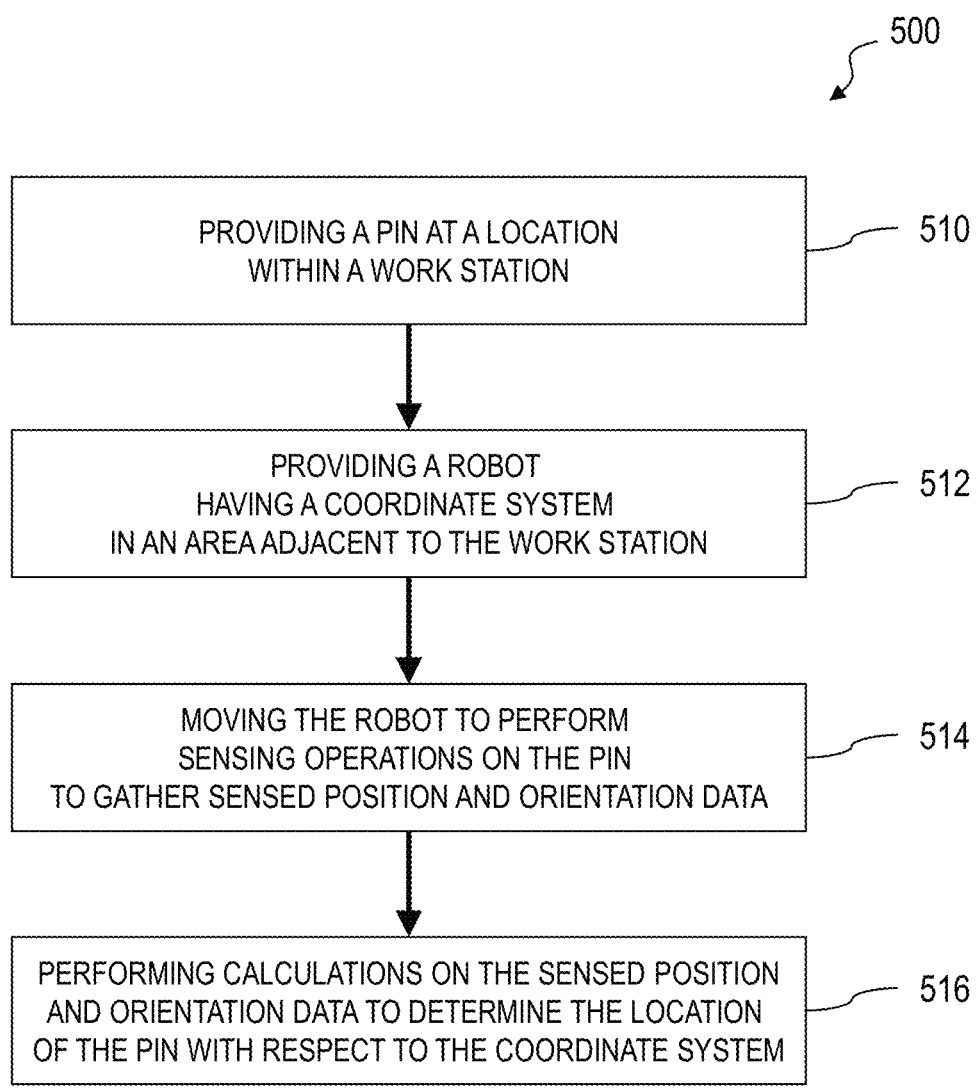

FIG. 15A
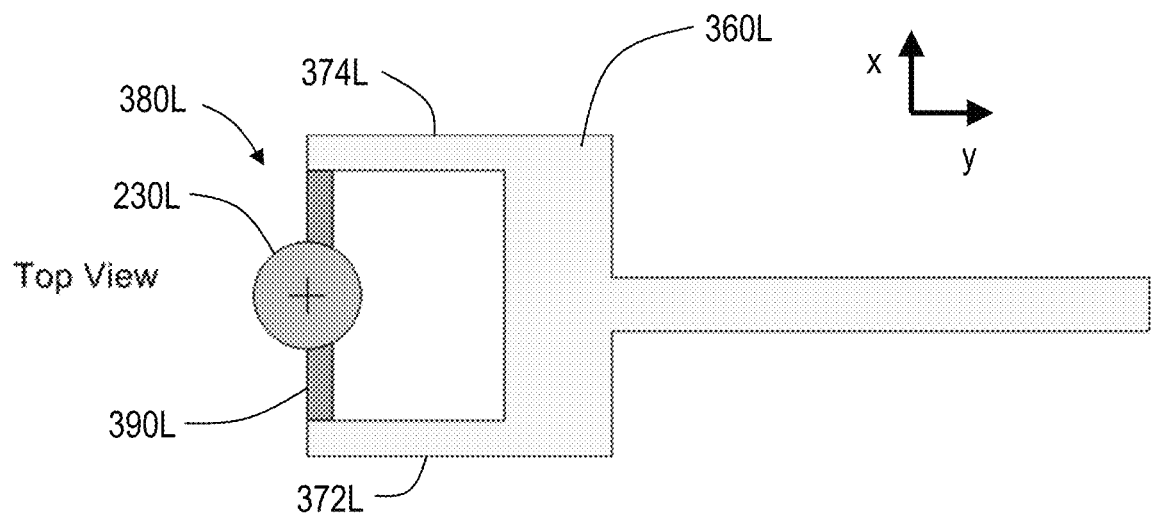
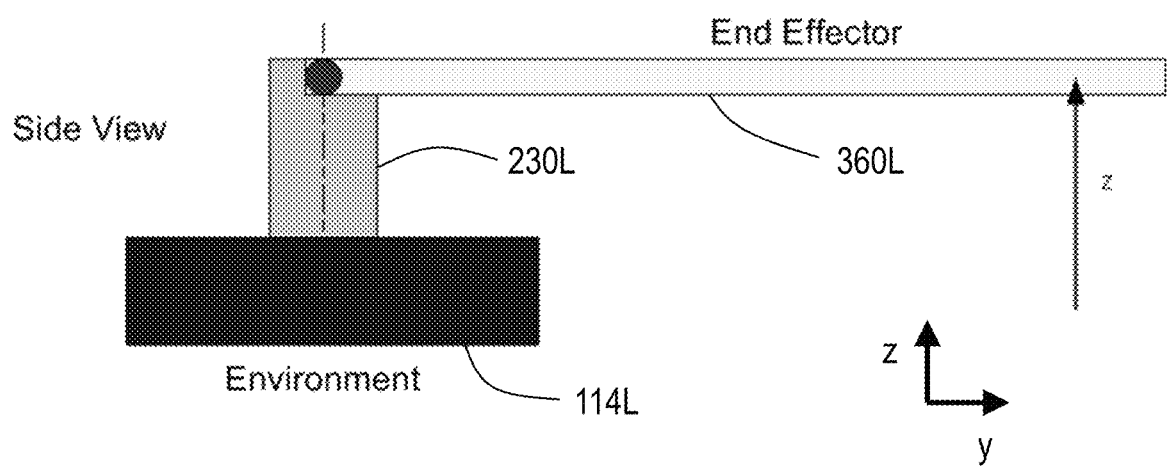
FIG. 15B

THROUGH-BEAM AUTO TEACHING

CROSS-REFERENCE TO RELATED APPLICATION

The present application claims priority to U.S. Provisional Application No. 62/802,759, filed on Feb. 8, 2019, the entire contents of which are herein incorporated by reference.

BACKGROUND OF THE INVENTION

Field of the Invention

The present invention relates to teaching and control of a robot.

Discussion of the Background

Robots are used to handle many different types of objects. For example, robots are used to transport semiconductor wafers to and between work stations during the manufacturing of semiconductor devices. Accurate movements of the robot are important to prevent damage to the workpieces, the robot, and any other objects within a working environment. Therefore, once a robot is mounted within the working environment, it can be important to teach the robot locations of various features within the working environment. Manual teaching of such locations can be time consuming and has the potential for human error. Accordingly, improved teaching method are needed.

SUMMARY OF THE INVENTION

The present disclosure advantageously provides a method of teaching an articulated robot. The method includes providing a first pin at a first location within a work station, and providing the articulated robot in an area adjacent to the work station. The articulated robot has a coordinate system, and the articulated robot has an arm and an end effector that is configured to pivot with respect to the arm. The end effector has a workpiece receiver with a first protruding member and a second protruding member, and a through-beam sensor including a light emitter provided on one of the first protruding member and the second protruding member. The through-beam sensor further includes a light receiver provided on an other of the first protruding member and the second protruding member. The through-beam sensor is configured to sense when an object is present between the light emitter and the light receiver. The method further includes moving the articulated robot to perform sensing operations in which the through-beam sensor senses the first pin. The sensing operations are performed while a position and/or an orientation of the end effector are varied for each sensing of the first pin to gather sensed position and orientation data, and the sensing operations are performed such that the first pin is located at different distances between the light emitter and the light receiver as the articulated robot moves the through-beam sensor across the first pin. The method also includes performing calculations on the sensed position and orientation data to determine the first location of the first pin with respect to the coordinate system of the articulated robot.

Embodiments of the method are provided where the end effector is configured to pivot with respect to the arm about a pivot axis, and where the method further includes performing calculations on the sensed position and orientation data to determine a distance extending in a direction normal to a light beam of the light emitter to the pivot axis, and an angle of the direction normal to the light beam with respect to the coordinate system of the articulated robot including an angular error of the end effector.

Embodiments of the method are provided further including: providing an optical target on a pivot axis of the end effector that is configured to pivot with respect to the arm; providing a scanning device at a fixed position with respect to the coordinate system of the articulated robot; using the scanning device to measure positional data of the optical target as the articulated robot is moved through a range of motion; and performing a regression analysis on the positional data to determine link lengths of links of the robot arm.

Embodiments of the method are provided further including: storing the link lengths on respective encoders of motors for rotating the links of the robot arm.

Embodiments of the method are provided where the work station has a work location at a predetermined position and orientation with respect to the first location of the first pin, and where the method further includes using the first location of the first pin to determine the work location with respect to the coordinate system of the articulated robot.

Embodiments of the method are provided where the work location overlaps the first location of the first pin in a horizontal plane.

Embodiments of the method are provided where the articulated robot includes: a base mounted in the area adjacent to the work station; the arm includes: a first arm member pivotally mounted to the base about a first pivot axis; a second arm member pivotally mounted to the first arm member about a second pivot axis; and a third arm member pivotally mounted to the second arm member about a third pivot axis; and the end effector pivotally mounted to the third arm member about a fourth pivot axis.

Embodiments of the method are provided where sensing operations include: a first sensing operation in which the articulated robot moves the through-beam sensor across the first pin with the end effector in a first orientation and at a first position; and a second sensing operation in which the articulated robot moves the through-beam sensor across the first pin with the end effector in the first orientation and at a second position different from the first position.

Embodiments of the method are provided where, in the first sensing operation, the first pin is a first distance between the light emitter and the light receiver when the through-beam sensor is moved across the first pin, and where, in the second sensing operation, the first pin is a second distance between the light emitter and the light receiver when the through-beam sensor is moved across the first pin, the second distance being different from the first distance.

Embodiments of the method are provided where sensing operations include: a third sensing operation in which the articulated robot moves the through-beam sensor across the first pin with the end effector in a second orientation and at a third position; and a fourth sensing operation in which the articulated robot moves the through-beam sensor across the first pin with the end effector in the second orientation and at a fourth position different from the third position.

Embodiments of the method are provided where the moving of the articulated robot to perform the sensing operations includes: initially moving the end effector to a predetermined approximate location of the first pin; and moving the end effector in an area around the predetermined approximate location of the first pin until the through-beam sensor senses the first pin.

Embodiments of the method are provided where the method further includes: providing a second pin at a second location within a work station; moving the articulated robot to perform further sensing operations in which the through-beam sensor senses the second pin, the further sensing operations being performed while the position and/or the orientation of the end effector are varied for each sensing of the second pin to gather further sensed position and orientation data, the further sensing operations are performed such that the second pin is located at different distances between the light emitter and the light receiver as the articulated robot moves the through-beam sensor across the second pin; and performing calculations on the further sensed position and orientation data to determine the second location of the second pin with respect to the coordinate system of the articulated robot.

Embodiments of the method are provided where the work station has a work location at a predetermined position and orientation with respect to the first location of the first pin and the second location of the second pin, and where the method further includes using the first location of the first pin and the second location of the second pin to determine the work location with respect to the coordinate system of the articulated robot.

Embodiments of the method are provided where the articulated robot is moved to perform twenty or more sensing operations, and where the performing of calculations on the sensed position and orientation data includes performing a regression analysis on the sensed position and orientation data.

Embodiments of the method are provided where the performing of calculations on the sensed position and orientation data includes performing a least squares approximation and a numerical search on the sensed position and orientation data to determine the first location of the first pin with respect to the coordinate system of the articulated robot.

Embodiments of the method are provided where the sensing operations are performed by both: moving the end effector away from the first pin such that the through-beam sensor moves across the first pin in a first direction; and moving the end effector toward the first pin such that the through-beam sensor moves across the first pin in a second direction opposite to the first direction, and where the method further includes using the sensed position and orientation data obtained by moving the end effector away from the first pin and moving the end effector toward the first pin to determine hysteresis error in the through-beam sensor.

The present disclosure additionally advantageously provides an articulated robot including: an arm; an end effector that is configured to pivot with respect to the arm, the end effector having a workpiece receiver with a first protruding member and a second protruding member; a through-beam sensor provided on the end effector, the through-beam sensor including a light emitter provided on one of the first protruding member and the second protruding member, the through-beam sensor further including a light receiver provided on an other of the first protruding member and the second protruding member, the through-beam sensor being configured to sense when an object is present between the light emitter and the light receiver; and a controller including at least one processor defining a coordinate system for the articulated robot, the at least one processor being configured to control one or more motors of the articulated robot to move the arm and the end effector to perform sensing operations in which the through-beam sensor senses a first pin provided at a first location within a work station, the sensing operations being performed while a position and/or an orientation of the end effector are varied for each sensing of the first pin to gather sensed position and orientation data, the sensing operations are performed such that the first pin is located at different distances between the light emitter and the light receiver as the articulated robot moves the through-beam sensor across the first pin, the at least one processor being configured to perform calculations on the sensed position and orientation data to determine the first location of the first pin with respect to the coordinate system of the articulated robot.

Embodiments of the robot are provided where the end effector is configured to pivot with respect to the arm about a pivot axis, and where the at least one processor is further configured to perform calculations on the sensed position and orientation data to determine a distance extending in a direction normal to a light beam of the light emitter to the pivot axis, and an angle of the direction normal to the light beam with respect to the coordinate system of the articulated robot including an angular error of the end effector.

Embodiments of the robot are provided further including: an optical target provided on a pivot axis of the end effector that is configured to pivot with respect to the arm; and a scanning device at a fixed position with respect to the coordinate system of the articulated robot, the scanning device being configured to measure positional data of the optical target as the articulated robot is moved through a range of motion, where the at least one processor is further configured to perform a regression analysis on the positional data to determine link lengths of links of the robot arm.

Embodiments of the robot are provided where the link lengths are stored on respective encoders of the one or more motors for rotating the links of the robot arm.

Embodiments of the robot are provided where the robot further includes: a base mounted in the area adjacent to the work station, where the arm includes: a first arm member pivotally mounted to the base about a first pivot axis; a second arm member pivotally mounted to the first arm member about a second pivot axis; and a third arm member pivotally mounted to the second arm member about a third pivot axis, and where the end effector is pivotally mounted to the third arm member about a fourth pivot axis.

Embodiments of the robot are provided where the at least one processor is configured to control the one or more motors of the articulated robot to move the articulated robot to perform: a first sensing operation in which the through-beam sensor is moved across the first pin with the end effector in a first orientation and at a first position; and a second sensing operation in which the through-beam sensor is moved across the first pin with the end effector in the first orientation and at a second position different from the first position, where, in the first sensing operation, the first pin is a first distance between the light emitter and the light receiver when the through-beam sensor is moved across the first pin, and where, in the second sensing operation, the first pin is a second distance between the light emitter and the light receiver when the through-beam sensor is moved across the first pin, the second distance being different from the first distance.

Embodiments of the robot are provided where the at least one processor is configured to control the one or more motors of the articulated robot to move the articulated robot to perform: a first sensing operation in which the through-beam sensor is moved across the first pin with the end effector in a first orientation and at a first position; and a second sensing operation in which the through-beam sensor is moved across the first pin with the end effector in the first orientation and at a second position different from the first position, a third sensing operation in which the through-beam sensor is moved across the first pin with the end effector in a second orientation and at a third position; and a fourth sensing operation in which the through-beam sensor is moved across the first pin with the end effector in the second orientation and at a fourth position different from the third position.

Embodiments of the robot are provided where the at least one processor is configured to control the one or more motors of the articulated robot to move the arm and the end effector to perform further sensing operations in which the through-beam sensor senses a second pin provided at a second location within the work station, the further sensing operations being performed while the position and/or the orientation of the end effector are varied for each sensing of the second pin to gather further sensed position and orientation data, the further sensing operations are performed such that the second pin is located at different distances between the light emitter and the light receiver as the articulated robot moves the through-beam sensor across the second pin, the at least one processor being configured to perform calculations on the further sensed position and orientation data to determine the second location of the second pin with respect to the coordinate system of the articulated robot, the at least one processor being configured to use the first location of the first pin and the second location of the second pin to determine the work location with respect to the coordinate system of the articulated robot.

Embodiments of the robot are provided where the at least one processor being configured to control one or more motors of the articulated robot to move the arm and the end effector to perform twenty or more sensing operations, and where the at least one processor being configured to perform a regression analysis on the sensed position and orientation data.

Embodiments of the robot are provided where the at least one processor being configured to perform a least squares approximation and a numerical search on the sensed position and orientation data to determine the first location of the first pin with respect to the coordinate system of the articulated robot.

Embodiments of the robot are provided where the at least one processor is configured to control the one or more motors of the articulated robot to move the arm and the end effector to perform the sensing operations by both: moving the end effector away from the first pin such that the through-beam sensor moves across the first pin in a first direction; and moving the end effector toward the first pin such that the through-beam sensor moves across the first pin in a second direction opposite to the first direction, and where the at least one processor is configured to use the sensed position and orientation data obtained by moving the end effector away from the first pin and moving the end effector toward the first pin to determine hysteresis error in the through-beam sensor.

The present disclosure further advantageously provides a non-transitory computer readable medium storing a program which, when executed by one or more processors, cause the one or more processors to: define a coordinate system for an articulated robot, the articulated robot including: an arm; an end effector that is configured to pivot with respect to the arm, the end effector having a workpiece receiver with a first protruding member and a second protruding member; and a through-beam sensor provided on the end effector, the through-beam sensor including a light emitter provided on one of the first protruding member and the second protruding member, the through-beam sensor further including a light receiver provided on an other of the first protruding member and the second protruding member, the through-beam sensor being configured to sense when an object is present between the light emitter and the light receiver; control one or more motors of the articulated robot to move the arm and the end effector to perform sensing operations in which the through-beam sensor senses a first pin provided at a first location within a work station, the sensing operations being performed while a position and/or an orientation of the end effector are varied for each sensing of the first pin to gather sensed position and orientation data, the sensing operations are performed such that the first pin is located at different distances between the light emitter and the light receiver as the articulated robot moves the through-beam sensor across the first pin; and perform calculations on the sensed position and orientation data to determine the first location of the first pin with respect to the coordinate system of the articulated robot.

Embodiments of the non-transitory computer readable medium storing a program are provided where the end effector is configured to pivot with respect to the arm about a pivot axis, and where the one or more processors are caused to perform calculations on the sensed position and orientation data to determine a distance extending in a direction normal to a light beam of the light emitter to the pivot axis, and an angle of the direction normal to the light beam with respect to the coordinate system of the articulated robot including an angular error of the end effector.

Embodiments of the non-transitory computer readable medium storing a program are provided where an optical target is provided on a pivot axis of the end effector that is configured to pivot with respect to the arm, where a scanning device is provided at a fixed position with respect to the coordinate system of the articulated robot, the scanning device being configured to measure positional data of the optical target as the articulated robot is moved through a range of motion, and where the one or more processors are caused to perform a regression analysis on the positional data to determine link lengths of links of the robot arm.

Embodiments of the non-transitory computer readable medium storing a program are provided where the link lengths are stored on respective encoders of the one or more motors for rotating the links of the robot arm.

Embodiments of the non-transitory computer readable medium storing a program are provided where the one or more processors are caused to control one or more motors of the articulated robot to move the arm and the end effector to perform twenty or more sensing operations, and where the one or more processors are caused to perform a regression analysis on the sensed position and orientation data.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 3 is a side view of an additional embodiment of a robot and a controller for use in a system for auto teaching the robot;

FIG. 4 is a side view of an additional embodiment of a robot and a controller for use in a system for auto teaching the robot;

FIG. 5 is a top view of an additional embodiment of a robot for use in a system for auto teaching the robot;

FIGS. 6A-6H are top views of an end effector of FIG. 5 performing sensing operations on a pin;

FIG. 8 is a flowchart showing an embodiment of a method of teaching a robot;

FIG. 15A is a top plan view showing a pin and an end effector showing a method of determining a z position, and FIG. 15B is a side view of the pin and the end effector shown in FIG. 15A;

DETAILED DESCRIPTION OF EXEMPLARY EMBODIMENTS OF THE INVENTION

Figure 1:
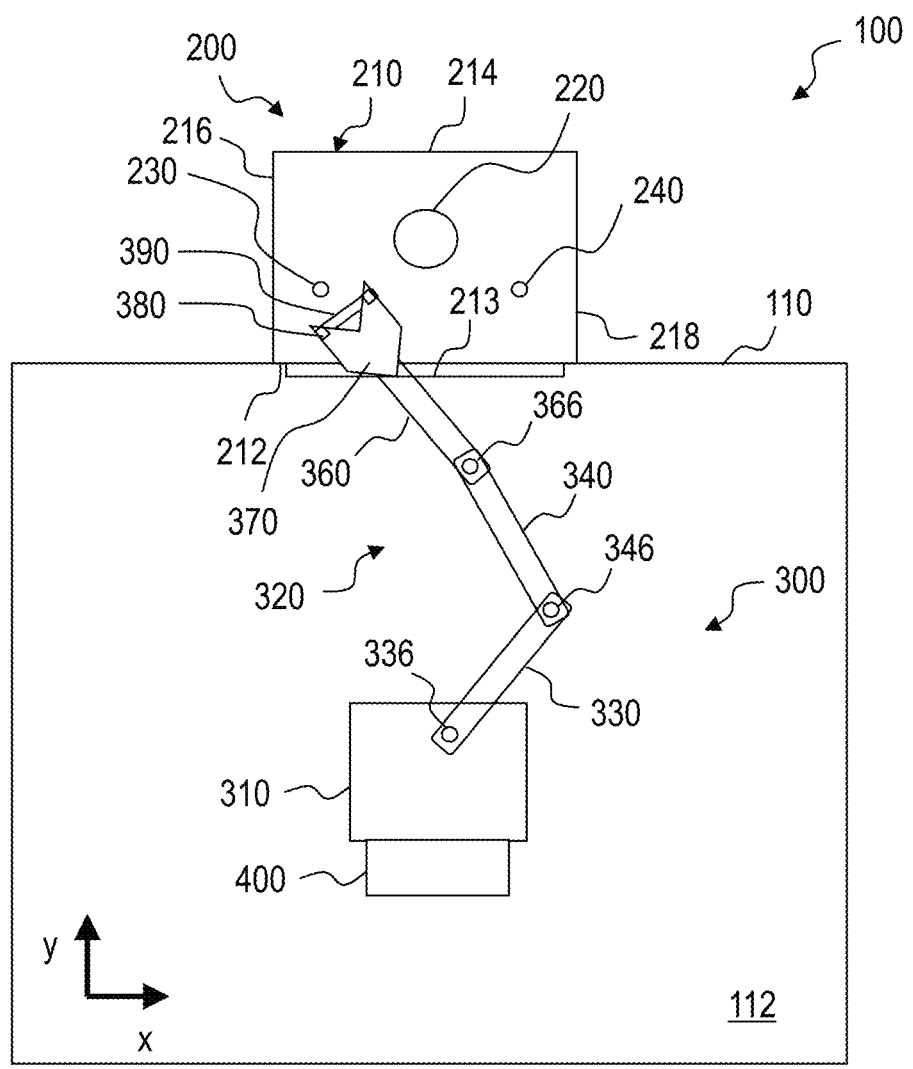
FIG. 1 is a top view of an embodiment of a system for auto teaching a robot.

Embodiments of the present invention will be described hereinafter with reference to the accompanying drawings. In the following description, the constituent elements having substantially the same function and arrangement are denoted by the same reference numerals, and repetitive descriptions will be made only when necessary.

Embodiments described herein advantageously provide a method, apparatus, non-transitory computer readable medium storing a program, and system to automatically teach a robot positions of one or more stations about a field of interest (FI) using sensors on the robot.

Embodiments described herein allow for accurate placing of a workpiece at a desired location in a work station. For example, embodiments described herein allow for accurate placing of a semiconductor wafer by an articulated robot at a desired location in a work station, such as a processing station, storage station, or the other work station utilized during semiconductor manufacturing. In such situations, it is desirable to accurately identify the location of the station with respect to the articulated robot in order to ensure accurate and safe movement of the wafer within the field of interest including the work station. Manual teaching of locations of stations is time consuming and has the potential for human error. Embodiments described herein allow for accurately determining the pin location and thereby allowing for movement of the wafer to a wafer placement/retrieval location (also referred to herein as a work location) within a few millimeters, and preferably within 100 microns.

Embodiments described herein can be used any time a new robot is mounted in a field of interest or is manually adjusted (after damage) in the field of interest (or tool environment). In embodiments described herein, the articulated robot orients itself in the field of interest in which it is placed in relation to one or more work stations. A work station can be a semiconductor processing apparatus or a work station can simply be an area within the field of interest that is designated for workpiece placement and/or retrieval. Embodiments described herein allow the robot to "feel out" exactly where the different stations are within the field of interest so that robot can accurately interact with the stations. The robot will be told ahead of time where it should roughly start looking for a given configuration by giving the robot a predetermined approximate location of the pin. The workpiece or wafer need not be present during the auto teaching process, but can be present if desired. In situations where an end effector is being used to map the field of interest, such a process can be performed without the wafer on the end effector. The auto teaching process can be used periodically to verify or track the performance of the robot. For example, if thermal expansion is of concern for a particular robot within a particular environment, then the auto teaching process can be repeated over time as the robot heats up. The robot can make adjustments based on changes in the location identified during such subsequent processes.

The auto teaching process can be performed using only one pin, or the auto teaching process can be performed using more than one pin. If a pin can be positioned at the location at which the workpiece will be placed or retrieved, then a single pin can be used, and the location of the pin can be identified using the auto teaching process. If the workpiece will be placed at or retrieved from a location other than the exact location of the pin (e.g., if the placement of a pin at the location at which you want to place or retrieve the wafer will cause interference with the wafer), then two pins can be used. Ideally, the pin would not be offset from the wafer placement/retrieval location; however, due to interference, the pins may need to be offset to the side, in front, back, etc. of the wafer placement/retrieval location. Therefore, if pins are used that are offset from the wafer placement/retrieval location, then it is necessary to know the position and orientation from the plural pins to the wafer placement/retrieval location, which can be accomplished with two points (i.e., the pins) in a plane. In such a situation, the pins are used as a reference, and then the end effector of the robot can be moved to a final destination at the placement/retrieval location.

By determining the location of the pins, an entire layout of the work station can be determined. Once the location of the pins are determined, the robot can then determine precisely where the wafer will be placed within the station, or precisely where the wafer will be retrieved from within the station. The layout of the station will be tightly toleranced with respect to the locations of the pins such that, once the positions and orientations of the pins are determined, then the robot can determine the layout of components within the stations including the location of the workpiece placement/retrieval location.

FIG. 1 depicts an embodiment of a system 100 including a mounting area 110, a work station 200 adjacent to the mounting area 110, and an articulated robot 300 mounted in the mounting area 110. The mounted area 110 can be enclosed area or an open area in which the robot 300 is provided. The mounting area 110 includes a mounting surface 112, such as a floor or ceiling upon with the robot 300 can be fixed.

The work station 200 can be a semiconductor processing apparatus or a work station can simply be an area within the field of interest that is designated for workpiece placement and/or retrieval. The work station 200 shown in FIG. 1 includes a housing 210 with side walls 212, 214, 216, and 218. The side wall 212 has a door 213 that can be opened and closed, such that the door 213 can be opened to allow access by the robot 300 and closed during processing of the workpiece. The work station 200 includes a workpiece placement/retrieval location 220, a first pin 230, and a second pin 240. As discussed above, the layout of the work station 200 will be tightly toleranced with respect to the first pin 230 and/or the second pin 240 such that the location and orientation of the pins are known with respect to the locations and orientations of the other components of the workstation 200, such as the side walls 212, 214, 216, and 218, the door 213, and the workpiece placement/retrieval location 220. Thus, the work station 200 has a work location 220 at a predetermined position and orientation with respect to a location of the first pin 230 and/or the second pin 240.

Additional work stations can be provided about the perimeter of the mounted area 110, or even within the mounted area 110. The locations of work locations within such addition work stations can either be determined by the location with respect to work station 200 and the pin(s) therein if such positional relationships are known, or by providing additional pin(s) within the additional work stations for sensing operations therewith.

In an alternative embodiment, the first pin could be provided at the workpiece placement/retrieval location 220 such that the first pin overlaps the workpiece placement/retrieval location 220 in a horizontal plane. If such a placement of the first pin at the workpiece placement/retrieval location 220 would interfere with the use or operation of the workpiece placement/retrieval location 220, it might be possible to place the first pin above or below the workpiece placement/retrieval location 220 such that the first pin overlaps the workpiece placement/retrieval location 220 in the horizontal plane. In such a case, the first pin could be used to accurately determine the workpiece placement/retrieval location 220 and then a z axis adjustment of the end effector could be made such that the workpiece placement/retrieval location 220 can be used without interference of the first pin. However, if such a configuration still results in interference with the use or operation of the workpiece placement/retrieval location 220, then the auto teaching process can use both the first pin 230 and the second pin 240.

The articulated robot 300 depicted in FIG. 1 includes a base 310 mounted in the area 110 adjacent to the work station 200, and an arm 320. In this embodiment, the arm 320 includes an arm member 330 pivotally mounted to the base 310 about a pivot axis 336, and an arm member 340 pivotally mounted to the arm member 330 about a pivot axis 346. An end effector 360 is pivotally mounted to arm member 340 about a pivot axis (or wrist axis) 366. (Note that pivot axis 366 can alternatively extend in the x-y plane, rather than in the z direction as shown in this embodiment.) The end effector 360 is configured to pivot with respect to the arm 320, and the end effector 360 has a workpiece receiver 370 with a through-beam sensor 380 mounted on the end effector 360, as will be described in greater detail below. The through-beam sensor 380 including a light emitter that emits a light beam 390 and a light receiver. The through-beam sensor 380 being configured to sense when an object is present between the light emitter and the light receiver, as will be described in greater detail below.

A controller 400 is provided in the system 100 depicted in FIG. 1. The controller can be provided adjacent to the base or incorporated within the base or other portion of the robot or provided at a remote location with connection via a network.

Figure 2:
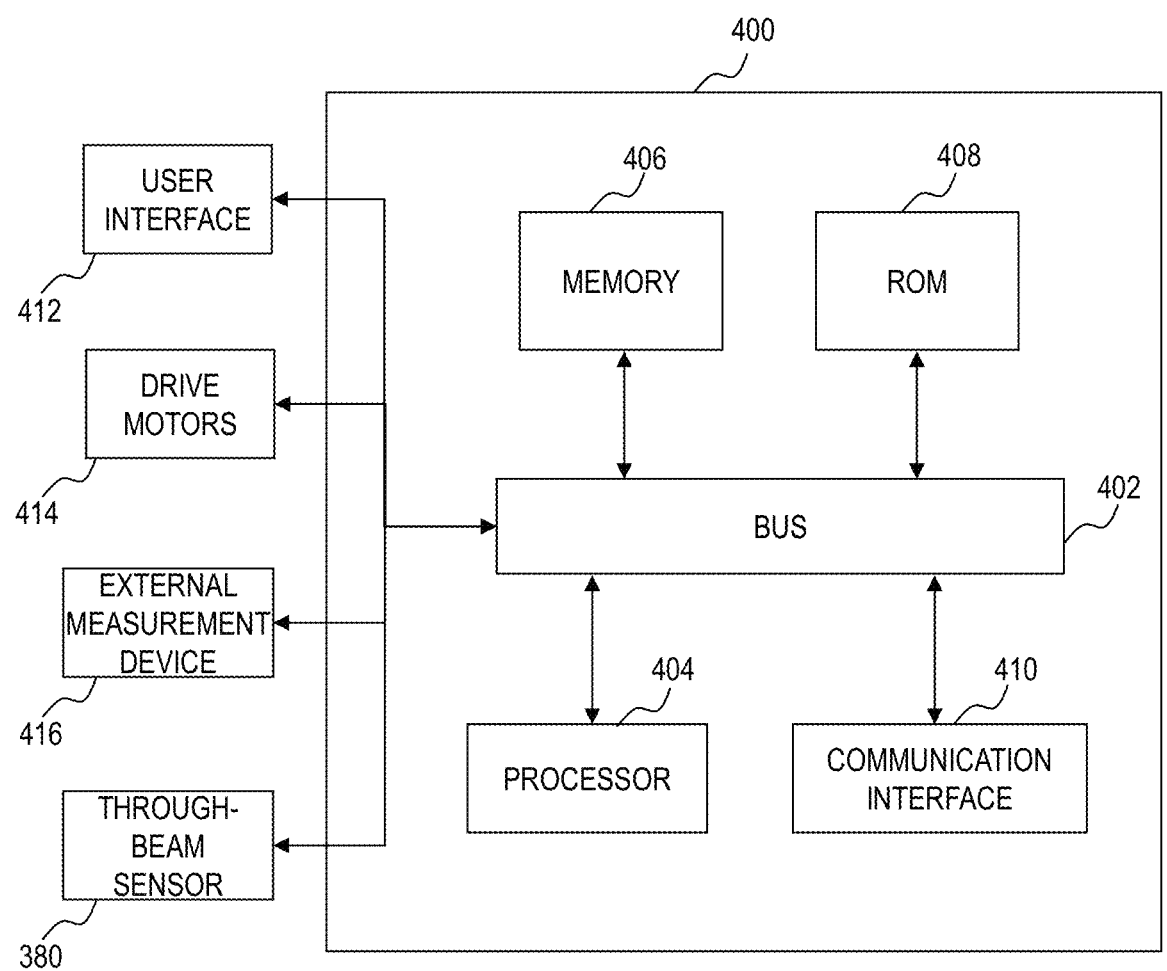
FIG. 2 is a schematic view of an embodiment of a controller and associated devices for use in the system for auto teaching a robot.

FIG. 2 illustrates an embodiment of the controller (computer) 400 with which an embodiment of the invention may be implemented. Although controller 400 is depicted with respect to a particular device or equipment, it is contemplated that other devices or equipment (e.g., network elements, servers, etc.) within FIG. 2 can deploy the illustrated hardware and components of controller 400. The controller 400 is programmed (e.g., via computer program code or instructions) to provide the functionality described herein and includes a communication mechanism such as a bus 402 for passing information between other internal and external components of the controller 400. One or more processors 404 for processing information are coupled with the bus 402 to perform a set of operations on information as specified by computer program code.

The controller 400 also includes a memory 406 coupled to bus 410. The memory 406, such as a random access memory (RAM) or other dynamic storage device, stores information including processor instructions. The memory 406 is also used by the processor 404 to store temporary values during execution of processor instructions. The controller 400 also includes a read only memory (ROM) 408 or other static storage device coupled to the bus 402 for storing static information, including instructions, that is not changed by the controller 400. The controller 400 includes a communication interface 410 that allows the controller 400 to communicate with other devices or equipment (e.g., network elements, servers, etc.)

Information, including user input instructions, is provided to the bus 402 for use by the processor 404 from a user interface 412, such as a keyboard containing alphanumeric keys operated by a human user, a display device, a pointing device (such as a mouse or a trackball or cursor direction keys).

Drive motors 414 (e.g., motors 312A, 338A, 348A, 358A depicted in FIG. 3 and discussed below that are used to rotate arm members (links) of the robot) can include encoders and can communicate with the processor 404 via the bus 402 in order to send and receive data, operating instructions/commands, or other information therebetween. The processor 404 can control operation of the drive motors 414 using operating instructions/commands in order to control rotation (e.g., start, stop, direction (e.g., clockwise, counterclockwise), speed, etc.) of output shafts of the drive motors 414.

An external measurement device 416 (e.g. Automated Precision Inc. (API) tracker (sensor, scanning device), etc.) can communicate with the processor 404 via the bus 402 in order to send and receive data, operating instructions/commands, or other information therebetween. The processor 404 can control operation of the external measurement device 416 using operating instructions/commands in order to control actuation of the external measurement device 416.

A through-beam sensor 380 can communicate with the processor 404 via the bus 402 in order to send and receive data, operating instructions/commands, or other information therebetween. The processor 404 can control operation of the through-beam sensor 380 using operating instructions/ commands in order to control operation of the through-beam sensor 380 in conjunction with the operation of the drive motors 414 and/or the external measurement device 380.

The controller 400 including at least one processor 404 defining a coordinate system for the articulated robot. In order to perform accurate placement and/or retrieval of a wafer at the workpiece placement/retrieval location (work location), the controller 400 needs to determine the location of one or more pins within the work station, which has (have) a predetermined position and orientation with respect to the work location, in order to accurately determine the work location with respect to the coordinate system of the articulated robot. Thus, the at least one processor 404 is configured to control one or more motors of the articulated robot to move the arm and the end effector to perform sensing operations in which the through-beam sensor senses the first pin provided at a first location within the work station. As will be described in greater detail below, the sensing operations are performed while a position and/or an orientation of the end effector are varied for each sensing of the first pin to gather sensed position and orientation data, and the sensing operations are performed such that the first pin is located at different distances between the light emitter and the light receiver as the articulated robot moves the through-beam sensor across the first pin. The at least one processor 404 then performs calculations on the sensed position and orientation data to determine the first location of the first pin with respect to the coordinate system of the articulated robot.

Thus, the controller 400 includes a non-transitory computer readable medium (see, e.g., memory 406, ROM 408) storing a program which, when executed by one or more processors (see, e.g., processor(s) 404), cause the one or more processors to: define a coordinate system for an articulated robot, embodiments of which are described herein; control one or more motors (see, e.g., drive motor(s) 414) of the articulated robot to move an arm and an end effector to perform sensing operations in which a through-beam sensor (see, e.g., through-beam sensor 380) senses a first pin provided at a first location within a work station, the sensing operations being performed while a position and/or an orientation of the end effector are varied for each sensing of the first pin to gather sensed position and orientation data, the sensing operations are performed such that the first pin is located at different distances between the light emitter and the light receiver as the articulated robot moves the through-beam sensor across the first pin; and perform calculations on the sensed position and orientation data to determine the first location of the first pin with respect to the coordinate system of the articulated robot, as described herein.

FIG. 3 depicts an additional embodiment of an articulated robot 300A mounted on a mounting surface 112A in a mounting area and including a controller 400A. The articulated robot 300A includes a first base 310A provided on top of a second base 314A. The second base 314A can either be a stationary mount or can include a lift device that can raise and lower the first base 310A in a z direction, thereby raising and lowering the arm 320A and end effector 360A.

The articulated robot 300A includes an arm 320A including an arm member (or first arm member) 330A pivotally mounted to the first base 310A about a pivot axis (or first pivot axis) 336A, an arm member (or second arm member) 340A pivotally mounted to the arm member 330A about a pivot axis (or second pivot axis) 346A, and an arm member (or third arm member) 350A pivotally mounted to the arm member 340A about a pivot axis (or third pivot axis) 356A. An end effector 360A is pivotally mounted to arm member 350A about a pivot axis (or fourth pivot axis) 366A. The end effector 360A has a workpiece receiver 370A with a through-beam sensor 380A mounted on an upper surface of the end effector 360A.

The arm member 330A has a first end 332A pivotally mounted to the first base 310A about the pivot axis 336A, and driven in rotation by drive motor 312A with an encoder 313A. The arm member 340A has a first end 342A pivotally mounted to a second end 334A of the arm member 330A about the pivot axis 346A, and driven in rotation by drive motor 338A with an encoder 339A. The arm member 350A has a first end 352A pivotally mounted to a second end 344A of the arm member 340A about the pivot axis 356A, and driven in rotation by drive motor 348A with an encoder 349A. The end effector 360A has a first end 362A pivotally mounted to a second end 354A of the arm member 350A about the pivot axis 366A, and driven in rotation by drive motor 358A with an encoder 359A. The through-beam sensor 380A is mounted on a second end 364A of the end effector 360A.

FIG. 4 depicts a further embodiment of an articulated robot 300B mounted on a mounting surface 112B in a mounting area and including a controller 400B. The articulated robot 300B includes a first base 310B provided on a side of a second base 314B. The second base 314B includes a lift device that can raise and lower the first base 310B in a z direction, thereby raising and lowering the arm 320B and end effector 360B. The lift device includes a housing having a side 314B, helically threaded rod (or plural parallel rods) 316B provided within the housing, and a drive motor 318B configured to rotate the rod (or rods) 316B about longitudinal axes thereof. The first base 310B has brackets 311B that threadedly engage with the rod (or rods) 316B such that the rotation of the rod (or rods) 316B raises and lowers the first base 310B in the z direction depending upon the clockwise or counterclockwise rotation of the rod (or rods) 316B. The brackets 311B extend through a slot (or slot) that vertically extend along the side 314B to guide the movement of the first base 310B in the z direction.

The articulated robot 300B includes an arm 320B including an arm member (or first arm member) 330B pivotally mounted to the base 310B about a pivot axis (or first pivot axis) 336B, an arm member (or second arm member) 340B pivotally mounted to the arm member 330B about a pivot axis (or second pivot axis) 346B, and an arm member (or third arm member) 350B pivotally mounted to the arm member 340B about a pivot axis (or third pivot axis) 356B. An end effector 360B is pivotally mounted to arm member 350B about a pivot axis (or fourth pivot axis) 366B. The end effector 360B has a workpiece receiver 370B with a through-beam sensor 380B mounted on a lower surface of the end effector 360B. The drive motor and pivot axis arrangement of the embodiment shown in FIG. 4 is the same as shown in and described with respect to FIG. 3.

FIG. 5 depicts a further embodiment of an articulated robot 300C. The articulated robot 300C includes a base 310C, and an arm 320C. In this embodiment, the arm 320C includes an arm member 330C pivotally mounted to the base 310C about a pivot axis 336C, and an arm member 340C pivotally mounted to the arm member 330C about a pivot axis 346C. An end effector 360C is pivotally mounted to the arm member 340C about a pivot axis 366C. The end effector 360C is configured to pivot with respect to the arm 320C, and the end effector 360C has a workpiece receiver 370C with a through-beam sensor 380C mounted on the end effector 360C. The workpiece receiver 370C can be used to transport a workpiece, such as a semiconductor wafer.

The workpiece receiver 370C has a first protruding member 372C and a second protruding member 374C with an open space 376C provided between the first protruding member 372C and the second protruding member 374C. The through-beam sensor 380C including a light emitter 382C that emits a light beam 390C and a light receiver 384C. The through-beam sensor 380C being configured to sense when an object is present between the light emitter 382C and the light receiver 384C, as will be described in greater detail below. In this embodiment, the light emitter 382C is provided on the first protruding member 372C and the light receiver 384C is provided on the second protruding member 374C; however, alternatively, the light emitter can be provided on the second protruding member 374C and the light receiver can be provided on the first protruding member 372C. The end effector 360C has a center of gravity 368C.

The controller of the robot can utilize the pivot axis 366C of the end effector 360C as a known location on the end effector 360C with respect to an entire layout of the end effector 360C including any other components mounted thereon (e.g., through-beam sensor 380C). Thus, the pivot axis 366C can be utilized as a reference point that is used to control the movement of the end effector 360C within the coordinate system of the articulated robot.

FIG. 5 depicts a pin 230C, such as pin 230 provided within work station 200 in FIG. 1. The arm 320C and the end effector 360C can be moved using the controller of the robot such that the light beam 390C of the through-beam sensor 380C passes between the light emitter 382C and the light receiver 384C to sense when the pin 230C is present between the light emitter and the light receiver, and to determine the position and orientation of the end effector 360C (e.g., at the pivot axis 366C) at the time the pin 230C is sensed by the through-beam sensor 380C.

FIGS. 6A-6H depict a series of movements of the end effector 360C (with the remainder of the robot not being depicted for simplicity of illustration) with respect to the pin 230C. Such movements can be referred to as a raking motion. FIGS. 6A-6H depict an exemplary embodiment of sensing operations in which the through-beam sensor 380C senses the pin. In these depictions, the articulated robot is moved to perform sensing operations in which the through-beam sensor senses the pin, and the sensing operations are performed while a position and/or an orientation of the end effector is varied for each sensing of the pin to gather sensed position and orientation data.

FIG. 6A depicts the end effector 360C being moved along a y direction as shown by arrow 10 toward the pin such that a pin-end effector positional relationship (i.e., a positional relationship between the pin and the end effector) 230C-1 changes to a pin-end effector positional relationship 230C-2 (shown in dashed lines in FIG. 6A since this positional relationship is achieved after the movement in FIG. 6A is completed). (It is noted that this movement does not need to occur along the y direction, but rather can be in any radial direction about a z axis perpendicular to the x direction and the y direction.) As the positional relationship 230C-1 changes to the positional relationship 230C-2, the pin crosses the light beam 390C at a distance D1-1 from the light emitter 382C and at a distance D2-1 from the light receiver 384C. The particular distance values are not critical, but rather such distances are important in relation to a change in distances described below with respect to FIGS. 6C and 6D. As the end effector 360C is moved toward the pin and the light beam 390C moves across the pin, the through-beam sensor 380C senses the pin and the position and orientation data of the end effector 360C and the pin is detected and stored.

FIG. 6B depicts the end effector 360C being moved along the y direction as shown by arrow 12 (in a direction opposite to the direction shown by arrow 10 in FIG. 6A) away from the pin such that a pin-end effector positional relationship 230C-2 changes to a pin-end effector positional relationship 230C-3. As the positional relationship 230C-2 changes to the positional relationship 230C-3, the pin crosses the light beam 390C at the distance D1-1 from the light emitter 382C and at the distance D2-1 from the light receiver 384C. As the end effector 360C is moved away from the pin and the light beam 390C moves across the pin, the through-beam sensor 380C senses the pin and the position and orientation data of the end effector 360C and the pin is detected and stored. It is noted that reverse movements, such as the movement shown in FIG. 6B is not necessary to the auto teaching process; however, this movement, which is a reverse movement of the movement shown in FIG. 6A, advantageously allows for identification of any hysteresis error in the through-beam sensor, as will be discussed in greater detail below.

FIG. 6C depicts the end effector 360C being moved along an x direction as shown by arrow 14 such that a pin-end effector positional relationship 230C-3 changes to a pin-end effector positional relationship 230C-4. (If the movement shown in FIG. 6B is not performed, as noted in the previous paragraph, then a movement in the y direction similar to the movement in FIG. 6C can be performed from positional relationship 230C-2.)

FIG. 6D depicts the end effector 360C being moved along the y direction as shown by arrow 16 toward the pin such that a pin-end effector positional relationship 230C-4 changes to a pin-end effector positional relationship 230C-5. As the positional relationship 230C-4 changes to the positional relationship 230C-5, the pin crosses the light beam 390C at the distance D1-2 from the light emitter 382C and at the distance D2-2 from the light receiver 384C. As the end effector 360C is moved toward the pin and the light beam 390C moves across the pin, the through-beam sensor 380C senses the pin and the position and orientation data of the end effector 360C and the pin is detected and stored.

Figure 6E:
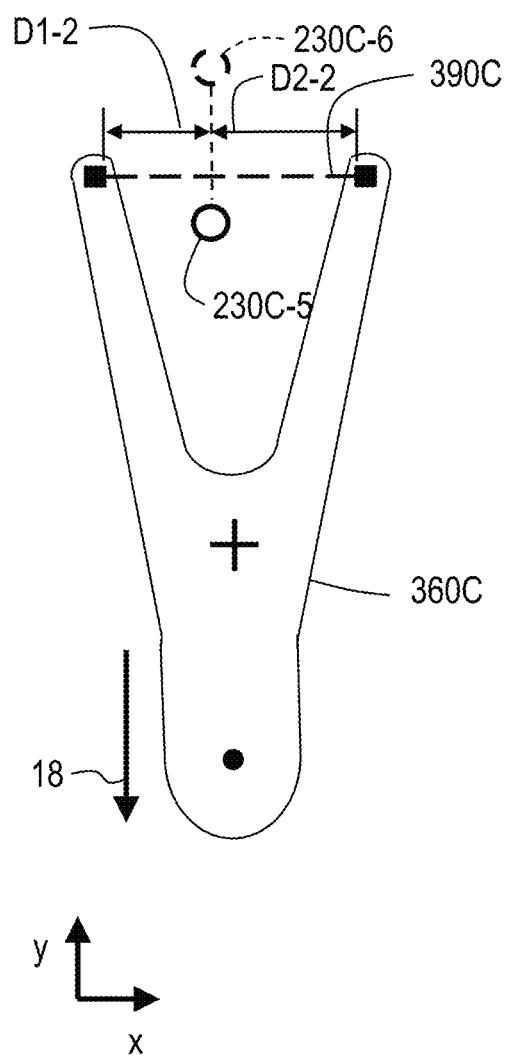

FIG. 6E depicts the end effector 360C being moved along the y direction as shown by arrow 18 (in a direction opposite to the direction shown by arrow 16 in FIG. 6D) away from the pin such that a pin-end effector positional relationship 230C-5 changes to a pin-end effector positional relationship 230C-6. As the positional relationship 230C-5 changes to the positional relationship 230C-6, the pin crosses the light beam 390C at the distance D1-2 from the light emitter 382C and at the distance D2-2 from the light receiver 384C. As the end effector 360C is moved away from the pin and the light beam 390C moves across the pin, the through-beam sensor 380C senses the pin and the position and orientation data of the end effector 360C and the pin is detected and stored.

Additional movements, such as are shown in FIGS. 6C-6E, can be performed such that the pin-end effector positional relationship moves closer and closer to the second protruding 374C within the open space 376C in order to gather additional position and orientation data. The movements in FIGS. 6A-6E show sensing operations in which the position of the end effector 360C is varied in the x-y plane, while the orientation of the end effector 360C is maintained at a constant.

Figure 6F:
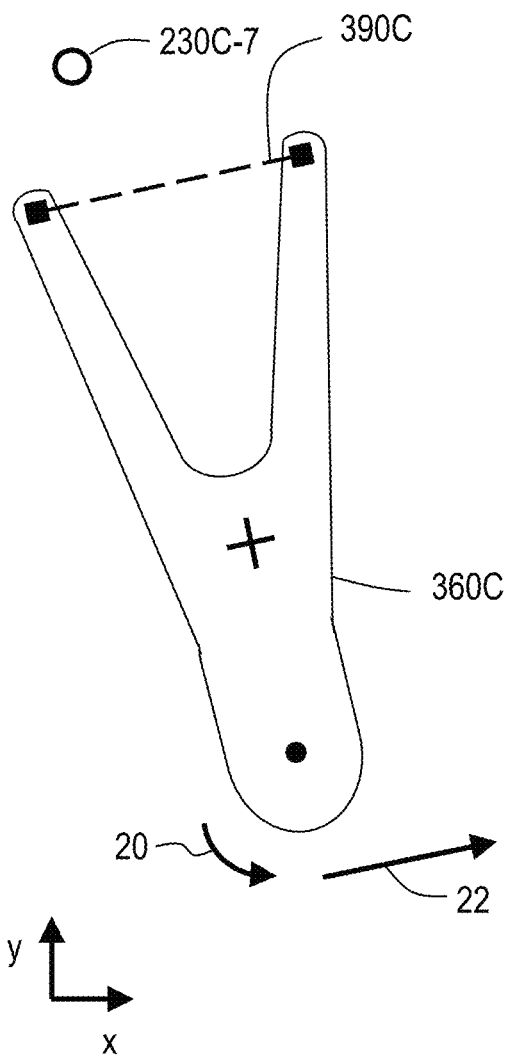

FIG. 6F depicts the end effector 360C being rotated about the z axis as shown by arrow 20 and moved along the x-y direction as shown by arrow 22 such that a pin-end effector positional relationship 230C-7 is reached. The movement shown in FIG. 6F changes the position and orientation of the end effector 360C.

FIG. 6G depicts the end effector 360C being moved along the x-y direction as shown by arrow 24 toward the pin such that a pin-end effector positional relationship 230C-7 changes to a pin-end effector positional relationship 230C-8. As the positional relationship 230C-7 changes to the positional relationship 230C-8, the pin crosses the light beam 390C at the distance D1-3 from the light emitter 382C and at the distance D2-3 from the light receiver 384C. As the end effector 360C is moved toward the pin and the light beam 390C moves across the pin, the through-beam sensor 380C senses the pin and the position and orientation data of the end effector 360C and the pin is detected and stored. The particular distance values if distance D1-3 and distance D2-3 are not critical, and could be the same as, similar to, or distinctly different from the distance D1-1 and distance D2-1.

FIG. 6H depicts the end effector 360C being moved along the x-y direction as shown by arrow 26 (in a direction opposite to the direction shown by arrow 24 in FIG. 6G) away from the pin such that a pin-end effector positional relationship 230C-8 changes to a pin-end effector positional relationship 230C-9. As the positional relationship 230C-8 changes to the positional relationship 230C-9, the pin crosses the light beam 390C at the distance D1-3 from the light emitter 382C and at the distance D2-3 from the light receiver 384C. As the end effector 360C is moved away from the pin and the light beam 390C moves across the pin, the through-beam sensor 380C senses the pin and the position and orientation data of the end effector 360C and the pin is detected and stored.

As noted above, FIGS. 6A-6H depict a series of movements of the end effector 360C with respect to the pin 230C, where such movements can be referred to as a raking motion in which plural or multiple linear parallel passes are made at the same orientation, then the orientation is changed to a new orientation and plural or multiple linear parallel passes are made at the new orientation, and this is repeated as needed to gather data. These movements can be performed by moving the end effector forward toward the pin (see, e.g., FIG. 6A) such that forward movement is stopped once the pin is sensed, then reverse away from the pin (see, e.g., FIG. 6B), then over (see, e.g., FIG. 6C), then forward toward the pin (see, e.g., FIG. 6D) such that forward movement is stopped once the pin is sensed, then reverse away from the pin (see, e.g., FIG. 6E), etc. until the pin reaches the second protruding member 374C, and then changing the position and orientation (see, e.g., FIG. 6F), and repeating the process at the new orientation. Alternatively, these movements can be performed by moving the end effector forward toward the pin, then over, then reverse away from the pin, then over, then forward toward the pin, then over, etc. until the pin reaches the second protruding member 374C, and then changing the position and orientation, and repeating the process at the new orientation.

Figure 7:
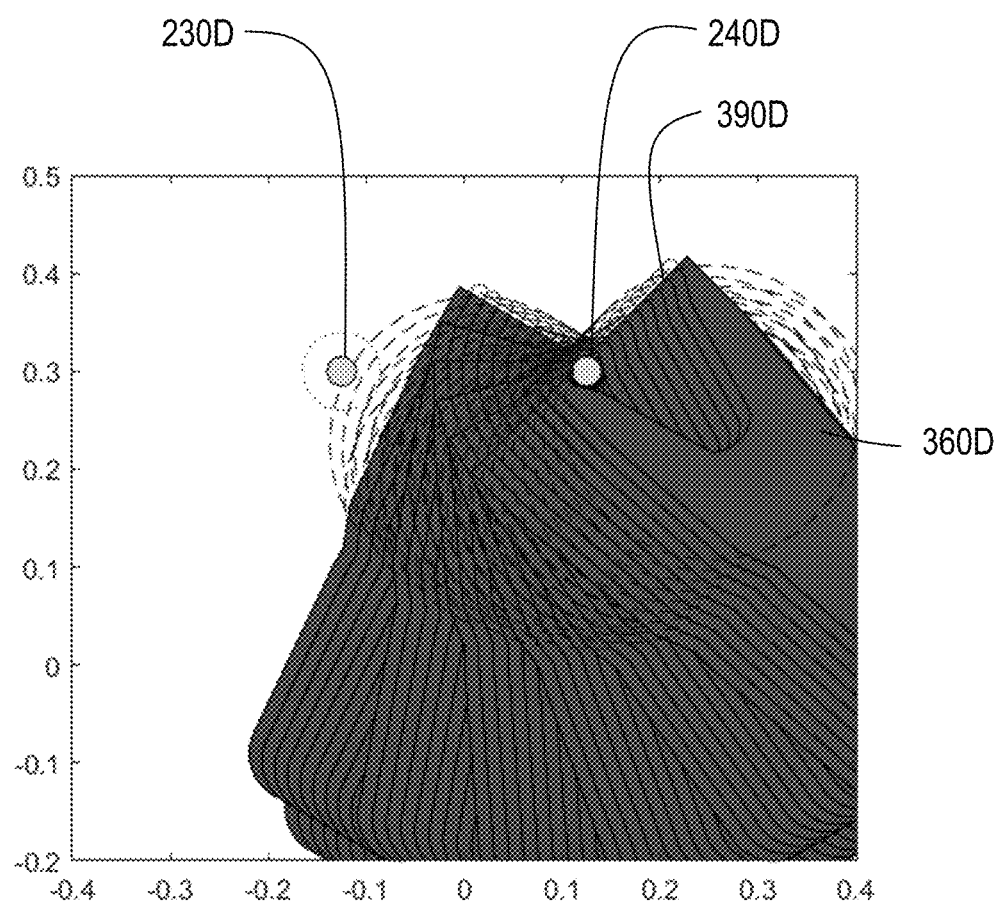
FIG. 7 is top view of an end effector at various overlaid positions and orientations performing sensing operations on a pin.

FIG. 7 depicts a series of movements of the end effector 360D with respect to a first pin 230D and a second pin 240D. FIG. 7 shows an overlay of various positions and orientations of the end effector 360D as the light beam 390C moves across the pin 240D, and the position and orientation data of the end effector 360D and the pin is detected and stored. In this depiction, multiple passes are made by the end effector 360D with the end effector 360D at a first orientation and at incremental different positions, then the orientation is changed to a second orientation and multiple passes are made by the end effector 360D with the end effector 360D at the second orientation and at incremental different positions, and this is repeated for a total of six different orientations. The end effector 360D can perform the same process for the first pin 230D if needed.

FIG. 7 shows multiple number of positions that are being measured. The more data that is collected, the more accurate the model being used. Since the process is automated, the process can be run by robot for as long as practical so that as many sensing operations can be performed as practical. Preferably, twenty or more data points could be collected using twenty or more sensing operations. More preferably, two hundred or more data points could be collected.

FIG. 8 depicts a flowchart showing an embodiment of a method 500 of teaching an articulated robot.

The method 500 includes a step 510 of providing a pin at a location within a work station, for example, as shown in FIG. 1. The layout of the station will be tightly toleranced with respect to the locations of the pin such that, once the position and orientation of the pin is determined, then the robot can determine the layout of components within the station including the location of the workpiece placement/retrieval location.

The method 500 includes a step 512 of providing the articulated robot in an area adjacent to the work station where the articulated robot has a coordinate system via which the robot can control movement of the robot. The articulated robot has an arm and an end effector that is configured to pivot with respect to the arm, and the end effector has a workpiece receiver with a first protruding member and a second protruding member. The end effector has a through-beam sensor including a light emitter provided on one of the first protruding member and the second protruding member. The through-beam sensor further includes a light receiver provided on an other of the first protruding member and the second protruding member. The through-beam sensor is configured to sense when an object (such as the pin) is present between the light emitter and the light receiver.

The method 500 includes a step 514 of moving the articulated robot to perform sensing operations in which the through-beam sensor senses the pin. The sensing operations are performed while a position and/or an orientation of the end effector are varied for each sensing of the pin to gather sensed position and orientation data, for example, as discussed above with respect to FIGS. 6A-6H and 7. The sensing operations are performed such that the pin is located at different distances between the light emitter and the light receiver as the articulated robot moves the through-beam sensor across the pin. Such sensing operations will be discussed in detail below.

The method 500 includes a step 516 of performing calculations on the sensed position and orientation data to determine the location of the pin with respect to the coordinate system of the articulated robot. Such calculations will be discussed in detail below.

Pin teaching to a single location is suitable for a polar coordinate articulated robot with two degrees of freedom in a horizontal plane. However, a robot with an articulated wrist or wrists needs to be taught both the location as well as the orientation of the desired placement. In such a case, the robot can identify the position of two pins to determine the desired absolute position and orientation.

A robot may be able to identify the position of a pin (also referred to as "teaching pin", "alignment pin," or "reference pin" herein) using the through-beam sensor. However, it is not always possible to locate the pin at the center of the area in which the wafer will be placed within the station. Furthermore, the location of the through-beam used for mapping is ideally and typically placed on the end of an end effector. For these reasons, the robot must accurately identify the location of the teaching pins, and then accurately move to a position and orientation relative to the teaching pins. The accuracy of this move will be dependent upon the full identification of the kinematics of the robot.

In the discussion of sensing operations and calculations on sensed position and orientation data set forth below, a first portion of the discussion will focus on identifying the kinematics of the end effector given knowledge of a robot wrist (e.g. a joint at pivot axis 366 in FIG. 1) in the horizontal plane. An end effector (also referred to as a "blade" herein) will typically be placed and aligned on a robot wrist in the field. The location and orientation of the through-beam emitter and receiver with respect to wrist center is subject to error from tolerance stack up. The location and orientation of the end effector's wrist center with respect to the robot wrist once installed is also subject to error. For the case of an articulated wrist, there are four linearly independent variables: teaching pin X location, teaching pin Y location, radial distance from end effector wrist center (i.e. pivot axis about which the wrist pivots) to the through-beam, and through-beam triggering error. Furthermore, there is one nonlinear variable: end effector orientation. The robot with articulated wrist has three controlled degrees of freedom in the horizontal plane (x, y, θ).

In an embodiment of the method described herein, the through-beam sensor is used to identify the position of the pin for a multitude of samples in which the controlled degrees of freedom are programmatically varied to approach the pin from different positions and orientations. The data is collected by the controller and then post-processed using a regression model, such as a least squares approximation to determine the linearly independent variables and an optimization search to determine the nonlinear variable. Essentially, the robot is moving around the pin, locating its position from different positions and orientations (see, e.g., FIGS. 6A-6H and 7) to best understand not only the location of the pin, but also the robot's own errors which include those of the through-beam sensor and the end effector. In the discussion of the embodiment of the method below, we first presume to accurately know the position of the robot wrist in the horizontal plane. Then, a method for acquiring this information is discussed.

A wide range of diverse information benefits the accuracy of the regression model. Data is collected by positioning the end effector through the range of three degrees of freedom (x, y, θ (or L, r, θ)). By taking many points through a series of different motions, we are also finding additional information including hysteresis and normal distance from the axis of rotation for a total of five different parameters. Furthermore, the information that is being found is more accurate than other processes, since we are averaging the results to find the best fit using the regression analysis. The exemplary regression analysis described herein involves the use of a least squares method; however, other numerical optimizations can be utilized to find these additional parameters.

Robot linkages (see, e.g., arm members and end effector described above) are typically not altered once the robot leaves a factory. The robot is commanded based on feedback from encoder positions of drive motors associated with joint angles. The resulting, actual position of the wrist will depend on the accuracy for which the kinematic model, the link lengths and encoder offset angles, are known. Alignment jigs can be used to attempt to identify the angular offsets corresponding to the true robot kinematics (i.e. homing of the robot). However, alignment jigs require mechanical tolerances and are subject to error. Furthermore, an alignment jig will not identify link lengths. In the embodiment of the method described herein, an external measurement device (such as an API tracker) can be used to identify the actual position of the robot wrist as the joints are manipulated through a diverse array of motion. Encoder data and the position data is collected and synchronized in time. Such data can then be post-processed using a least squares approximation to determine the robot's kinematic model: the link lengths and angular offsets. These values can then be stored on the robot and then read and used by the controller to provide for more accurate control of the robot.

Figure 9A:
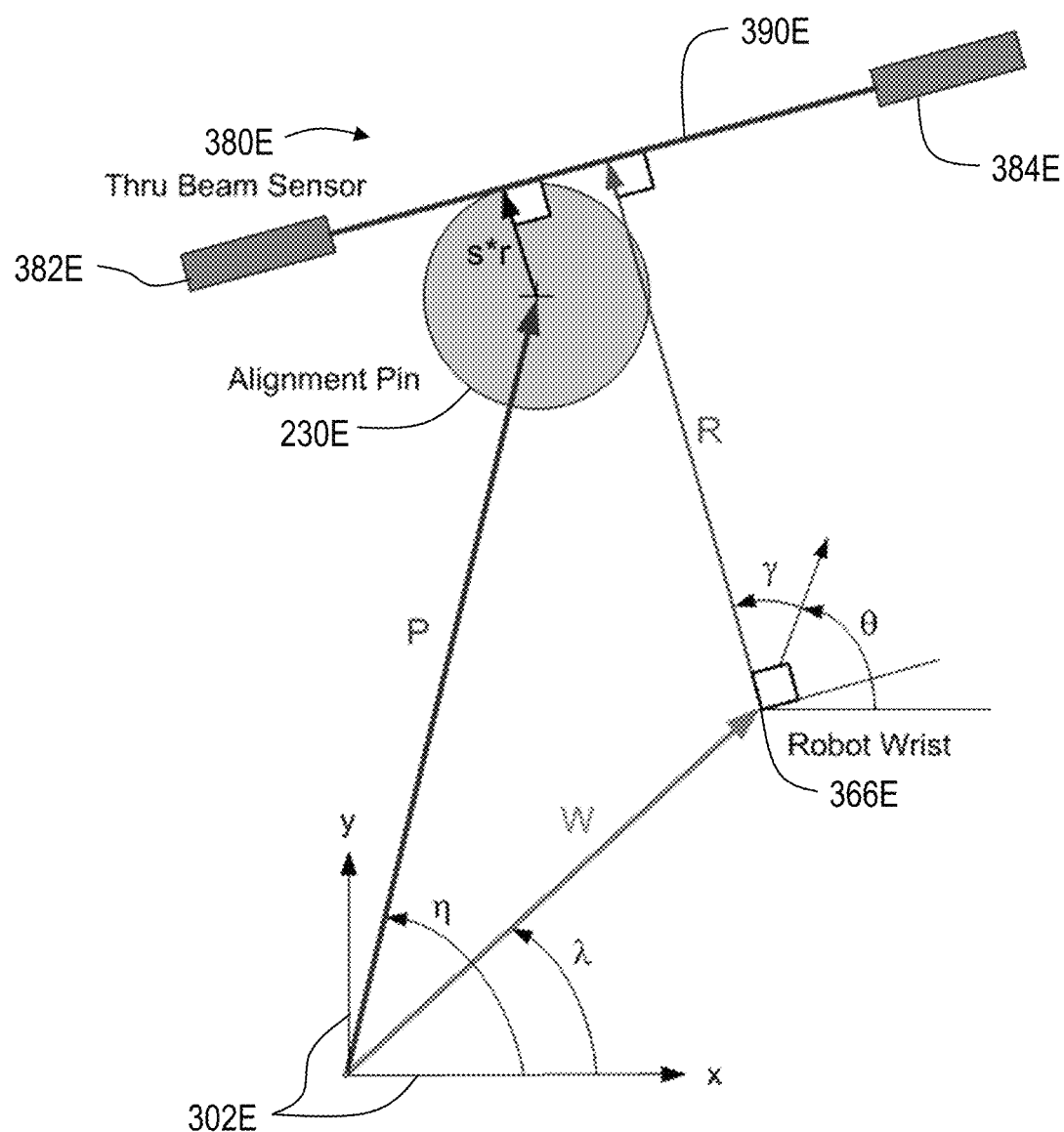
FIGS. 9A and 9B show relationships between features of a robot and an alignment pin.

In the through-beam auto teaching process, an alignment pin or two alignment pins are accurately located within a station through machining tolerances. FIG. 9A shows relationships between features of a robot and an alignment pin 230E. FIG. 9A shows feature of the robot including a coordinate system 302E of the robot, a robot wrist axis of rotation 366E, and a through-beam sensor 380E including a light emitter 382E that emits a light beam 390E and a light receiver 384E. The through-beam sensor 380E would be provided on an end effector as discussed in the embodiments described above. In the through-beam auto teaching process, we want to determine the location of the pin within the robot's inertial coordinate frame (also referred to as coordinate system herein) as represented by vector, P, shown in FIG. 9A.

The robot will have its own knowledge of the position of its wrist in the inertial coordinate frame as represented by the vector, W. A through-beam sensor is typically present for vertical mapping of a wafer, and therefore such a through-beam sensor can be conveniently used in the process described herein. The robot's intended absolute orientation of the end effector is represented by the angle, θ. A vector, R, exists that is orthogonal with the light beam 390E and passes through the wrist axis of rotation 366E. Vector, R, is a normal distance from the nominal beam center to the wrist's axis of rotation 366E (which is also a minimum distance from the axis of rotation to the beam). The pin 230E has a radius, r. Note that value, s, is equal to 1 or −1 when the light beam 390E is touching a side of the pin 290E furthest from or closest to the wrist, respectively. There can be some misalignment error (also referred to herein as orientation error, angular offset, angular error) in the actual orientation of the end effector with respect to the light beam 390E as represented by the angle, γ. (There can be some misalignment (or orientation) error in the orientation of the end effector as read by the encoder. This is especially true for end effectors that are replaced in the field. The through-beam sensor is attached to the end effector (with some reasonable accuracy), the blade is attached to the wrist, the wrist is mounted on the robot, and the reference is the encoder position. There is almost certainly a misalignment error between the encoder and such a stack up of parts that leads to the through-beam sensor, and therefore the method described herein allows us to best determine the angle of the end effector. We are ultimately needing to position the wafer with respect to the center of the end effector, so that angle.) A point of contact will be identified at which the light beam 390E will first be broken by the alignment pin 230E. The geometry can further be represented as in the relationships further set forth in FIG. 9B.

The scalar equation of distance at the point of contact can be written as:

$$P*\sin(\eta-\gamma-\theta+\pi/2)=R-s*r+W*\sin(\lambda-\gamma-\theta+\pi/2)$$

An angle, β, can be simplified as:

$$\beta=-\gamma-\theta+\pi/2$$

$$P*\sin(\eta+\beta)=R-s*r+W*\sin(\lambda+\beta)$$

From a trigonometric identity:

$$\sin(\eta+\beta)=\sin(\eta)*\cos(\beta)+\sin(\beta)*\cos(\eta)$$

$$P*\sin(\eta)*\cos(\beta)+P*\cos(\eta)*\sin(\beta)=R-s*r+\ldots$$
$$W*\sin(\lambda)*\cos(\beta)+W*\cos(\lambda)*\sin(\beta)$$

Simplifying further:

$$P_y*\cos(\beta)+P_x*\sin(\beta)=R-s*r+W_y*\cos(\beta)+W_x*\sin(\beta)$$

We assume to know the radii, R and r, the orientation, s, the wrist position and orientation, $W_x$, $W_y$, and θ, and even the orientation error, γ.

$$P_y*\cos(\beta)+P_x*\sin(\beta)=R-s*r+W_y*\cos(\beta)+W_x*\sin(\beta)$$

We wish to determine the unknowns, $P_x$ and $P_y$. The above equation can be solved by using, n, measured instances in which three robot degrees of freedom, $W_x$, $W_y$, and θ, are varied.

We first define the 2×1 vector, A, as follows:

$$A=[P_x P_y]^T$$

We define the n×2 vector, X, as follows:

$$X=[\sin(\beta)\cos(\beta)]$$

We define the n×1 vector, B, as follows:

$$B=R-s*r+W_y*\cos(\beta)+W_x*\sin(\beta)$$

Therefore, the equation can be written as:

$$X*A=B$$

Multiplying through by the transpose of X:

$$X^T*X*A=X^T*B$$

Multiplying through by the inverse:

$$A=(X^T*X)^{-1}*X^T*B$$

With A, we have the least squares approximation of the pin location.

The accuracy of the solution depends on the diversity of the matrix X and the vector B.

The auto teaching process intends to find the exact position of the pin 230E. However, it is likely that we will only know the approximate location of the pin within +/−15 mm. The robot will have to search the general area of the pin until the light beam 390E is tripped. For example, the robot can begin at the approximate location initially given and then move the end effector in a manner similar to the movements shown in FIGS. 6A-6H until the pins is sensed by the through-beam sensor. The robot has three degrees of freedom in the horizontal plane: x, y, and θ. We can impose one constraint by forcing the light beam 390E to be tangent to the approximated far side or near side of the pin 230E. Thus, we have two remaining degrees of freedom to generate the diversity of data that we need in the matrix X and the vector B. First, the angle, θ, of the end effector can be varied. Secondly, the light beam 390E itself has a safe length of +/−L. We may vary distance, l, through the range of +/−L.

Thus, for a fixed angle, θ, and a decreasing radius, r, we may solve for the commanded wrist position:

$$W_x=P_x+(s*r-R)*\cos(\gamma+\theta)+l*\sin(\gamma+\theta)$$

$$W_y=P_y+(s*r-R)*\sin(\gamma+\theta)-l*\cos(\gamma+\theta)$$

For the range of motion searched, we will determine the locations at which the through-beam is tripped.

Note, from the depiction in FIG. 7, that data is collected with the end effector 360D at numerous different orientations and with the pin 240D crossing the light beam 390D of the through-beam sensor at various locations along the length of the light beam 390D of the through-beam sensor (i.e. at various locations along the width of the open space of the protruding members (or forks) of the end effector 360D at which the emitter and receiver of the through-beam sensor are mounted.)

Note that is it possible, but not necessary, to get data from both a frontward approach and a rearward (or reverse) approach of the through-beam sensor. While it is not necessary to get data from both the frontward and rearward approaches, data from both the frontward and rearward approaches will help identify any hysteresis error in the through-beam sensor. In other words, if the light beam does not trigger exactly on a center of the light beam, then data from both the frontward and rearward approaches will identify that error as δb, as discussed below with respect to FIG. 10. This is advantageous, since we do need to know the center of the end effector with respect to the through-beam sensor.

Figure 9B:
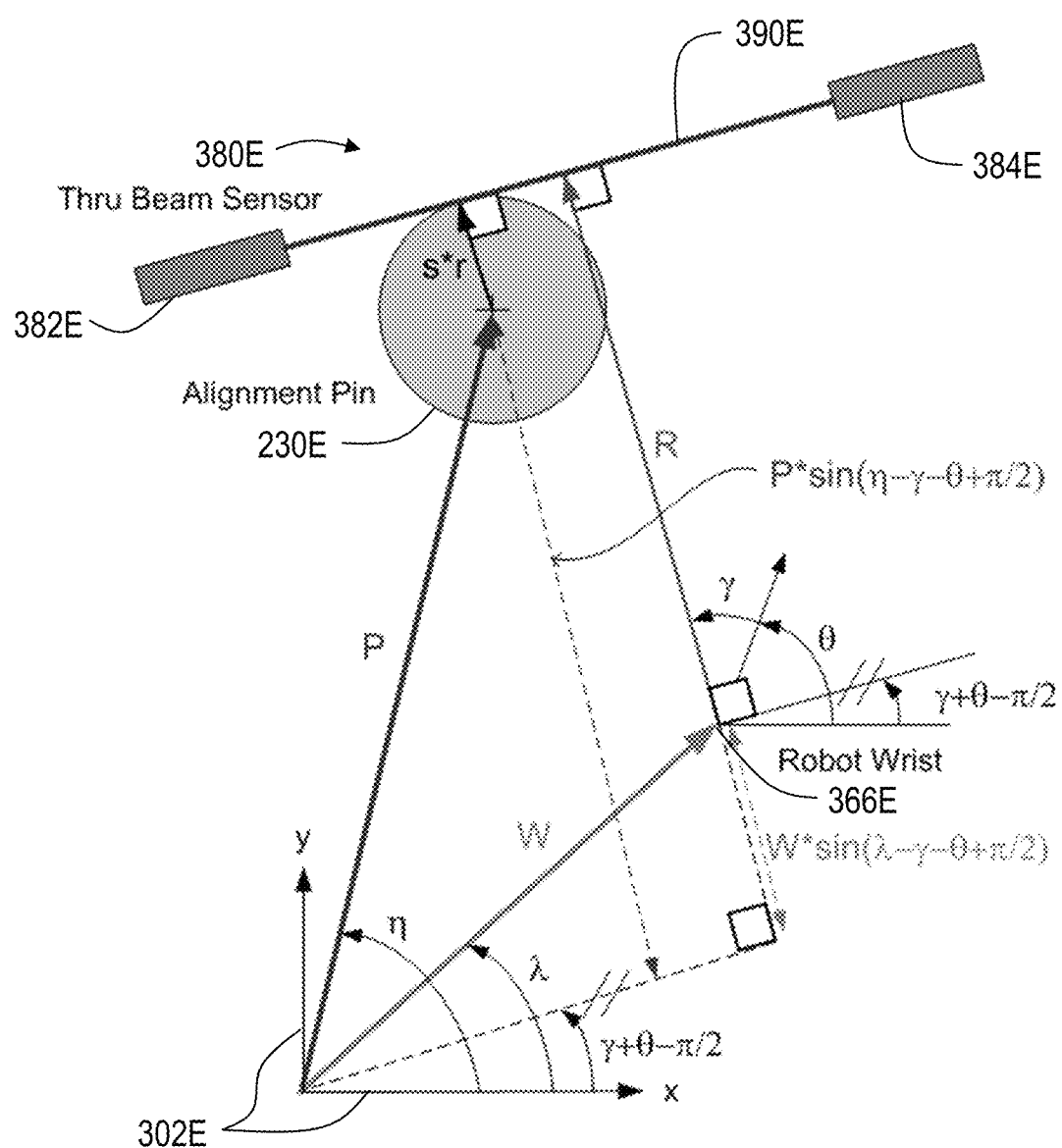

The flowing describes solving for the errors in the end effector. As shown in FIGS. 7, 9A, and 9B, there are two potential unknowns in the end effector: radial distance, R, and angular error, γ. The end effector will typically be installed and aligned to be parallel on the robot by a user. Thus, there is no opportunity to characterize these values at the factory. Dowel pins could potentially be used for reference, but the use of dowel pins can impact the end effectors ability to be adjustable.

Figure 10:
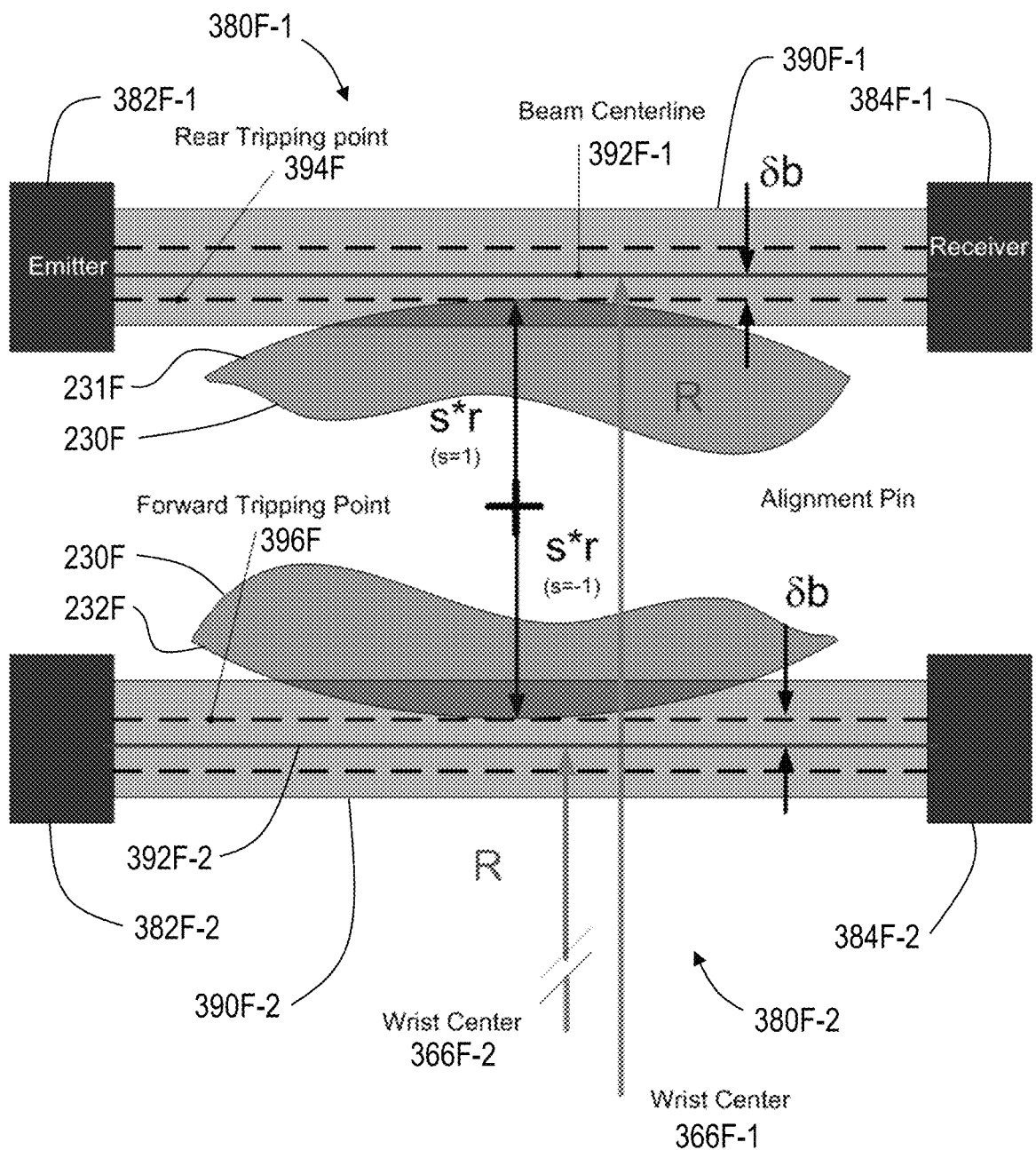
FIG. 10 depicts two representations of a through beam sensor approaching a pin from opposite sides of the pin.

FIG. 10 depicts two representations of a through beam sensor approaching a pin from opposite sides of the pin. FIG. 10 shows a first representation of a through-beam sensor 380E-1 approaching a first surface portion 231F of the pin 230F from a rearward side of a light beam 390E-1 (e.g., similar to the motion shown in FIG. 6B), and a second representation of a through-beam sensor 380E-2 approaching a second surface portion 232F of the pin 230F from a forward side of a light beam 390E-2 (e.g., similar to the motion shown in FIG. 6A). The first and second representations are representations of the same through-beam sensor provided at two different relationships with respect to the pin 230F, and therefore the first and second representations have been depicted with different references characters for ease of description and depiction.

The first representation of the through-beam sensor 380E-1 includes a light emitter 382F-1 that emits a light beam 390E-1 and a light receiver 384F-1. The light beam 390E-1 has a beam centerline 392F-1 and a rear tripping point 394F, as described below. The beam centerline 390E-1 is provides at radius, R, from the wrist center axis 366F-1, as depicted.

The second representation of the through-beam sensor 380E-2 includes a light emitter 382F-2 that emits a light beam 390E-2 and a light receiver 384F-2. The light beam 390E-2 has a beam centerline 392F-2 and a forward tripping point 396F, as described below. The beam centerline 390E-2 is provides at radius, R, from the wrist center axis 366F-2, as depicted.

A true distance from the wrist axis to the light beam of the through-beam sensor depends on the alignment of the through-beam sensor with respect to the wrist center axis of rotation and also a distance at which the light beam is tripped. On one side of the through-beam sensor, the light emitter emits light. On the other side of the through-beam sensor, the light receiver receives the light. At some threshold, the light receiver will receive a reduced amount of total light to trigger an input/output (I/O) signal to the controller. This is called the tripping point. The tripping point may not be exactly at the beam centerline.

The tripping point can occur at some distance, a, from the beam centerline. It is assumed here that the distance, a, is symmetric about the beam centerline. By approaching from both sides of the light beam, we intend to distinguish error in radius, R, from distance, δb. Note that distance, a, will also identify a component of error associated with the radius of the pin; however, such error is believed to be small.

Going back to the original defining equation, $$P_y^*\cos(\beta)+P_x^*\sin(\beta)=R-s^*(r+\delta b)+W_y^*\cos(\beta)+W_x^*\sin(\beta)$$

We add two more unknowns to our earlier equations, R and r. Note that we will handle gamma in the subsequent discussion below.

$$P_y^*\cos(\beta)+P_x^*\sin(\beta)-R+s^*\delta b=-s^*r+W_y^*\cos(\beta)+W_x^*\sin(\beta)$$

We first define the 4×1 vector, A, as follows:

$$A=[P_x P_y R \delta b]^T$$

We define the n×4 vector, X, as follows:

$$X=[\sin(\beta) \cos(\beta) -1 s]$$

We define the n×1 vector, B, as follows:

$$B=W_y^*\cos(\beta)+W_x^*\sin(\beta)-s^*r$$

Therefore, the equation can be written as:

$$X^*A=B$$

Multiplying through by the transpose of X:

$$X^T*X^*A=X^T*B$$

Multiplying through by the inverse:

$$A=(X^T*X)^{-1}*X^T*B$$

With A, we have the least squares approximation of the pin location, the radius, R, and the effective pin radius, r.

Now we will search for β.

As we stated, we have left:

$$P_y^*\cos(\beta)+P_x^*\sin(\beta)-R-s^*r=W_y^*\cos(\beta)+W_x^*\sin(\beta)$$

Note again the definition of the angle, β:

$$\beta=-\gamma-\theta+\pi/2$$

Also note that our linearly independent variables, $P_y$ and $P_x$, are also multiplied by the sin or cos of the angle, β. We would not be able to simultaneously solve for $P_x$ and $P_y$ and β using the least squares method alone.

However, for an arbitrary value of γ, we can calculate the accuracy for which the least squares method satisfies the equation:

$$X^*A=B$$

$$E(\gamma)=\text{sum}(\text{abs}(X^*A-B))$$

$$E(\gamma)=\text{sum}(\text{abs}(X^*(X^T*X)^{-1}*X^T*B-B))$$

We can iteratively solve for γ which minimizes the function, E. This can be done through a brute force search, a gradient decent, or some other optimization.

A numerical simulation proving the capability of the algorithm is included in beta search numerical simulation discussed below.

Now a discussion of accuracy of the robot will be provided including a discussion of homing and encoder space, e.

Figure 11:
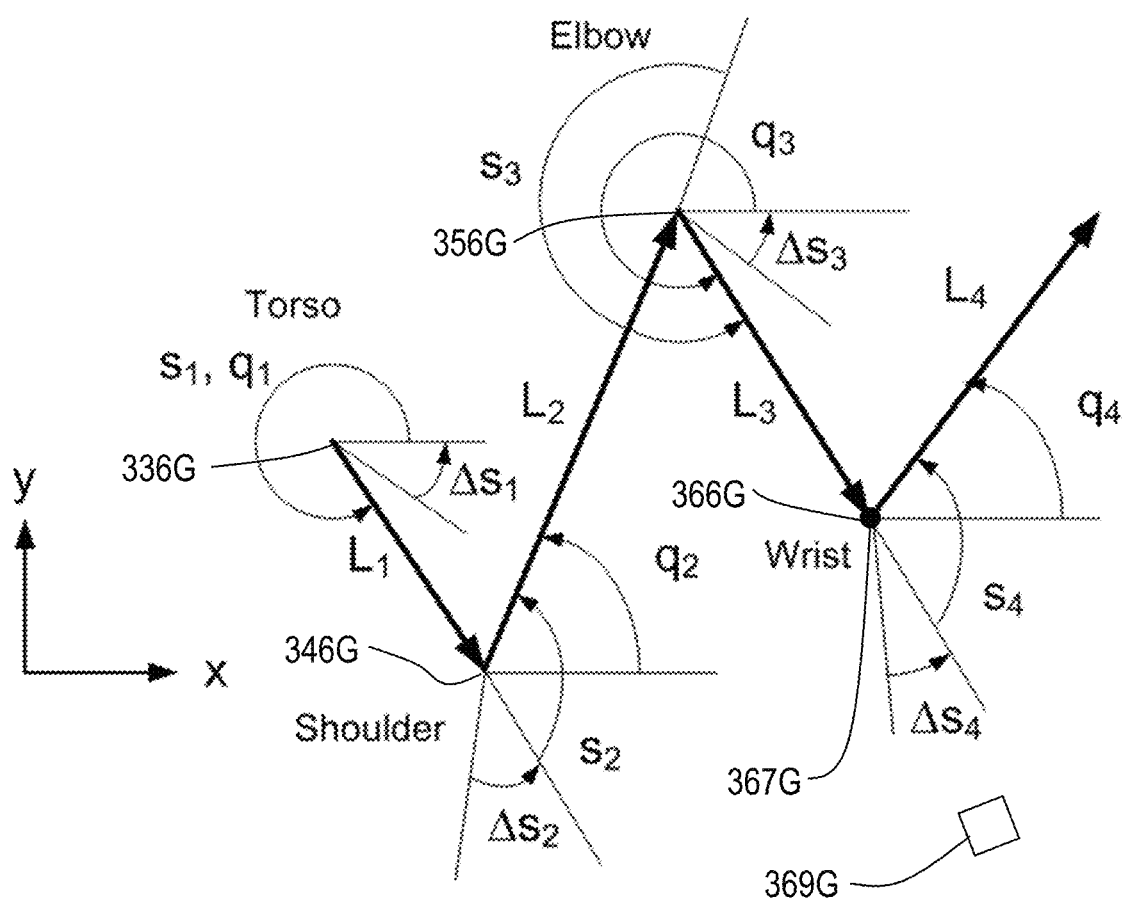
FIG. 11 shows relationships between features of a robot including a torso, a shoulder, an elbow, and a wrist.

FIG. 11 shows relationships between features of a robot including a torso 336G, a shoulder 346G, elbow 356G, and wrist 366G. (Such features correspond to features such as pivot axis 336A, pivot axis 346A, pivot axis 356A, and pivot axis 366A in FIG. 2.) The robot includes first link $L_1$, second link $L_2$, third link $L_3$, and fourth link $L_4$. (Such links are mathematical representations of link lengths (i.e., pivot axis to pivot axis, or pivot axis to point of interest, such as the through beam sensor) of features such as arm member 330A, arm member 340A, arm member 350A, and end effector 360A in FIG. 2.)

An optical target such as a Spherically Mounted Retroreflector (SMR) 367G is provided on the wrist 366G of the robot. A laser tracker (or scanning device) 369G is placed at any fixed location with respect to a robot center (or torso 336G). The laser tracker 369G can pivot and tilt to track the movement of the SMR on the wrist 366G. The tracker 369G can use either a laser or time of flight to determine a distance from the SMR. Encoder feedback on the tracker along with the radial distance allows the tracker to determine the position of the SMR in three dimensional space to an accuracy within 40 microns. The robot is moved through a full range of motion, thereby creating a diverse array of information. A kinematic model is fit to that data, the angular offsets and link lengths that most accurately fit the data are extracted from the kinematic model, for example, using a regression fit such as least squares approximation.

As a result of this analysis, each joint of the robot will have an associated angular adjustment and a link length. As each joint has an associated motor, the angular adjustment and the link length specific to that link can be stored on an encoder of the motor associated with that joint. In this way, any controller can be paired with a robot and the controller can read the information specific to the robot from the robot. Alternatively, the information can also be stored on a memory within the robot (see, e.g., memory 406).

In order to accurately determine the pin position, we must also accurately know the location of the robot wrist, the vector W. We found the q, b, and s spaces. We defined the values of s to be zero when a link is aligned and extended outward from the link to which it is mounted. However, the zero position for each joint is defined by the encoder at the joint and the raw encoder output will not necessarily conform to an ideal model when assembled as represented in FIG. 11.

We call the raw encoder output the e space where, $$e_1=s_1+\Delta s_1$$

$$e_2=s_2+\Delta s_2$$

$$e_3=s_3+\Delta s_3$$

$$e_4=s_4+\Delta s_4$$

Related art systems typically use an alignment jig or pin to place the robot links in a known posture. The quality of the alignment is dependent upon the tolerances of the jig and the arm itself. In the related art, nominal link lengths are assumed. The link length is defined by the distance separating an axis of rotation to the subsequent axis of rotation in the kinematic chain. In the related art, the axis of rotation is presumed to be at a position relative to the arm housing. In the following implementation, the true axis of rotation will be located from the kinematics of the robot's observed motion in the horizontal plane. We observe the robot motion, P, using the API sensor, writing the position in the x y plane as a complex value:

$$P=P_O+L_1*\exp(i*q_1)+L_2*\exp(i*q_2)+L_2*\exp(i*q_3)+L_4*\exp(i*q_3),$$

where $P_O$ is the complex origin of the robot center in the API's coordinate frame and the q's are in the absolute coordinate frame.

Using the definitions found earlier, we can substitute for the s space:

$$P=P_o+L_1*\exp(i*s+L_2*\exp(i*(s_1+s_2))+L_3*\exp(i*(s_1+s_2+s_3))+L_4*\exp(i*(s_1+s_2+s_3+s_4))$$

Using the definitions found above, we can substitute for the e space:

$$P=P_o+L_1*\exp(i*(e_1-\Delta s_1))+L_2*\exp(i*(e_1-\Delta s_1+e_2-\Delta s_2))L_3*\exp(i*(e_1-\Delta s_1+e_2-\Delta s_2+e_3-\Delta s_3))\ldots+L_4*\exp(i*(e_1-\Delta s_1+e_2-\Delta s_2+e_3-\Delta s_3+e_4-\Delta s_4))$$

We note the following identity:

$$\exp(i*(a+b))=\exp(i*a)*\exp(i*b),$$

and isolate the known encoder information from the link lengths and angular offsets we wish to determine:

$$P=1*P_o+\exp(i*(e_1)*L_1*\exp(i*-\Delta s_1)+\exp(i*(e_1+e_2))*L_2*\exp(i*(-\Delta s_1-\Delta s_2))+\exp(i*(e_1+e_2+e_3))*L_3*\exp(i*(-\Delta s_1-\Delta s_2-\Delta s_3))+\exp(i*(e_1+e_2+e_3+e_4))*L_4*\exp(i*(-\Delta s_1-\Delta s_2-\Delta s_3-\Delta s_4))$$

The known values are P, $e_1$, $e_2$, $e_3$, $e_4$, and the unknown values are $P_0$, $L_1$, $L_2$, $L_3$, $L_4$, $\Delta s_1$, $\Delta s_2$, $\Delta s_3$, $\Delta s_4$. We then consolidate in the following:

$$P=1*X_o+\exp(i*\Sigma e_1)*L_1*\exp(i*-\Delta q_1)\ldots+\exp(i*\Sigma e_{12})*L_2*\exp(i*-\Delta q_2)\ldots+\exp(i*\Sigma e_{13})*L_3*\exp(i*-\Delta q_3)\ldots+\exp(i*\Sigma e_{14})*L_4*\exp(i*-\Delta q_4)$$

(Above, the known values are P, $\Sigma e_1$, $\Sigma e_{12}$, $\Sigma e_{13}$, $\Sigma e_{14}$, and the unknown values are $X_0$, $L_1$, $L_2$, $L_3$, $L_4$, $\Delta q_1$, $\Delta q_2$, $\Delta q_3$, $\Delta q_4$.) We next write the above in matrix form:

$$P=[1\ \exp(i*\Sigma e_1)\exp(i*\Sigma e_{12})\exp(i*\Sigma e_{13})\exp(i*\Sigma e_{14})]\ldots*[X_oL_1*\exp(i*-\Delta q_1)L_2*\exp(i*-\Delta q_2)L_3*\exp(i*-\Delta q_3)L_4*\exp(i*-\Delta q_4)]^T$$

We add n rows of known encoder and position information to the above and maintain a single column vector of offsets. (Above, the known values are P, $\Sigma e_1$, $\Sigma e_{12}$, $\Sigma e_{13}$, $\Sigma e_{14}$, and the unknown values are $X_0$, $L_1$, $L_2$, $L_3$, $L_4$, $\Delta q_1$, $\Delta q_2$, $\Delta q_3$, $\Delta q_4$.)

We can also right the above in real terms to include x, y, and z,

We can write the above in simpler notation:

$$P=X*A$$

(Above, the known values are P, X, and the unknown value is A.) Where P is a n×1 complex column vector, X is a n×5 complex matrix, and A is a 5×1 complex column vector. We multiply through by the transpose of the X matrix.

$$X^T*P=X^T*X*A$$

This produces a square matrix that may be inverted:

$$(X^T*X)^{-1}*X^T*P=(X^T*X)^{-1}*X^T*X*A$$

$$(X^T*X)^{-1}*X^T*P=A$$

(Above, the known values are P, X, $X^T$, and the unknown value is A.) The above is the least squares approximation of the vector A. We then extract the values as in the following:

$$L_i=\operatorname{sqrt}(\operatorname{real}(A_i)^2+\operatorname{imag}(A_i)^2)$$

$$\Delta q_i=-a\tan 2(\operatorname{imag}(A_i),\operatorname{real}(A_i))$$

Note the negative sign in the above. We then solve for the individual encoder offsets:

$$\Delta s_1=\Delta q_1$$

$$\Delta s_2=\Delta q_2-\Delta q_1$$

$$\Delta s_3=\Delta q_3-\Delta q_2$$

$$\Delta s_4=\Delta q_4-\Delta q_3$$

In production of the robot, the $L_i$ and the $\Delta s_1$ parameters can be stored as two separate parameters on the eprom of the encoder of the drive motor(s). The controller can access these parameters and use them upon power up without the need for homing.

The angular offsets are important. It remains to be seen whether the absolute accuracy of the link lengths are critical to the overall accuracy of the robot in the atmospheric semiconductor robot application.

Given that the wafer is now being commanded in the Cartesian coordinate frame, identification of deviation in the link lengths should help to reduce the total error and thus the need for greater "buffer" space between the robot and the environment in which it operates. If the variation in link length is only 0.25 mm, then the total potential deviation and savings could be 1 mm.

Prior to this implementation, link lengths have been hard coded in the software/firmware. Singularity positions were based on nominal link lengths. If we are to use actual link lengths in the kinematics, then the singular positions would need to be updated as taught positions to ensure that the robot can mathematically pass through the singularity without issue.

If it turns out to be problematic and the benefit to accuracy is not significant, the actual link lengths can be ignored and only the angular offsets used.

The user may question whether a robot has suffered some impact resulting in relative displacement of the encoder with the arm. We will likely need a method of determining whether or not the mechanism has been displaced. This can be done with an alignment jig. The robot could also be retaught to the original alignment pin in the tool. Assuming that the pin has not moved, a consistent pin position identification would imply that the robot has not been damaged.

Similar to what is done in the field today, an arm would not be repairable in the field. A robot can be returned to the manufacturer for arm replacement and the robot can be recalibrated and the encoder eprom updated for the replaced motor. We should note that this will require that anyone repairing the robot will need to utilize an API sensor or equivalent which could come at substantial cost.

Figure 12:
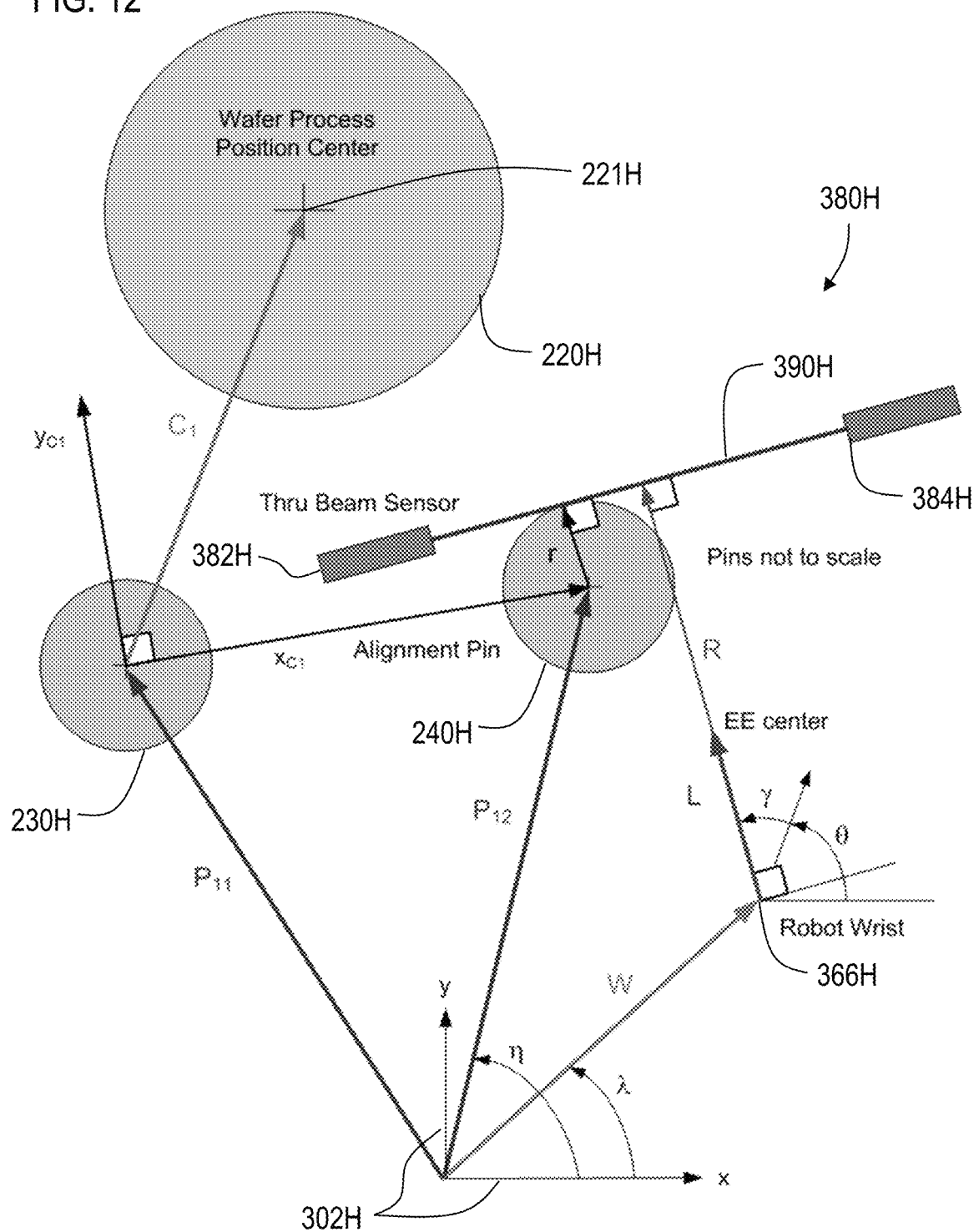
FIG. 12 shows relationships between features of a robot, alignment pins, and a work location having a center.
Figure 13:
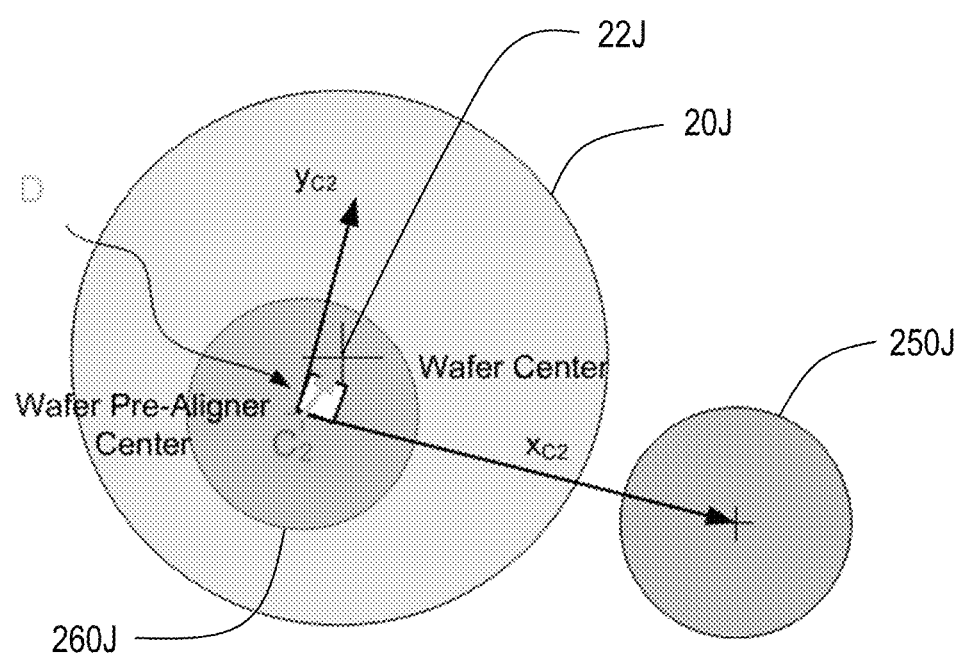
FIG. 13 shows relationships between a semiconductor wafer having a center, a wafer pre-aligner, and a further alignment pin.
Figure 14:
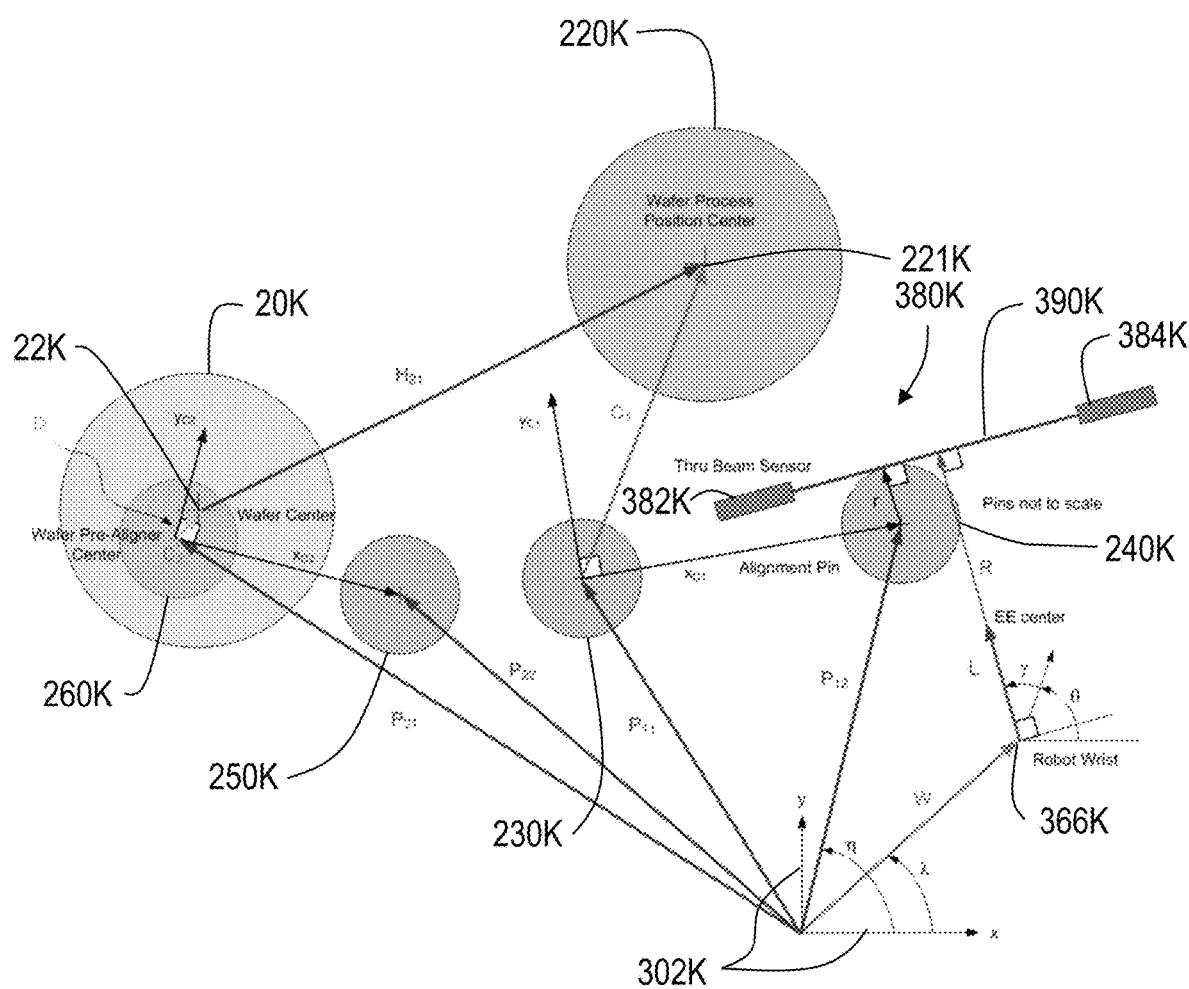
FIG. 14 shows relationships between features of a robot, alignment pins, a work location having a center, a semiconductor wafer having a center, a wafer pre-aligner, and a further alignment pin.

The following discussion of FIGS. 12-14 describes pin placement within the work station and identification of the pin location.

FIG. 12 shows relationships between features of a robot, alignment pins 230H and 240H, and a work location 220H having a center 221H. FIG. 12 shows features of the robot including a coordinate system 302H of the robot, a robot wrist axis of rotation 366H, and a through-beam sensor 380H including a light emitter 382H that emits a light beam 390H and a light receiver 384H. The through-beam sensor 380H would be provided on an end effector as discussed in the embodiments described above.

Identification of pin location is used to orient the robot within the working environment. The pin or pins could be left in the environment indefinitely, and used for recalibration at later times, if needed. However, the pin itself can be an obstruction. Accordingly, in the two pin situation shown in FIG. 12, the process accurately identifies a work location, remote from the pins, for which to place a wafer. To identify such a work location in planar space, two pins used, as shown in FIG. 12.

The pins 230H and 240H identify the position and orientation of the wafer station coordinate frame, C, in the x-y plane. The location of the pins 230H and 240H in the wafer station will be accurately placed with respect to the work location 220H through machining tolerances of the environment and will be defined by the vector, C. Thus, the robot will understand that it is to place the wafer at the position $P_{11}+C_1$ as shown in FIG. 12 with an orientation as defined by the C coordinate frame. This is represented by the following vector equation:

$$W_1+L_1=P_{11}+C_1$$

The center of the wafer on the blade with respect to the robot wrist 366H is defined by the vector, L. In the case of an edge grip end effector, the magnitude and orientation of the vector L is defined by fingers and plunger of the edge grip end effector. When the wafer is picked in a given position, the plunger will push the wafer into a fixed, repeatable position. In this case, the relationship between the vector R and vector L must be known through machining tolerances or further calibration. In the case of a friction grip or vacuum grip end effector, the vector L is defined merely by the position of the wafer on the blade as it is picked by the robot. Ultimately, we wish to accurately determine the location of the wafer at one station and accurately place it at a subsequent station.

FIG. 13 shows relationships between a semiconductor wafer 20J having a center 22J, a wafer pre-aligner 260J, and a further alignment pin 250J. A pre-aligner is often used in conjunction with a work station to determine a position of the wafer center 22J and the orientation of the wafer 20J with respect to a notch on the wafer perimeter (not shown). The wafer will be rotated and the magnitude and orientation of the vector D determined as shown in FIG. 13.

An absolute position and orientation of the pre-aligner can be identified by measuring two pins. For simplicity, a pre-aligner shaft 260J and a pin 250J can be used to determine the absolute position and orientation of the pre-aligner. The pin 250J can be attached to a base of the pre-aligner, and thus can be used to determine the orientation of the pre-aligner. At the factory, the orientation of the encoder may be taught with respect to the pins with a locating feature.

An example move from a pre-aligner to the process station (or work station) is shown in FIG. 14.

FIG. 14 shows relationships between features of a robot, alignment pins 230K and 240K, a work location 220K having a center 221K, a semiconductor wafer 20K having a center 22K, a wafer pre-aligner 260K, and a further alignment pin 250K. FIG. 14 shows features of the robot including a coordinate system 302K of the robot, a robot wrist axis of rotation 366K, and a through-beam sensor 380K including a light emitter 382K that emits a light beam 390K and a light receiver 384K. The through-beam sensor 380K would be provided on an end effector as discussed in the embodiments described above.

Note that the vector D is the location of the wafer with respect to the pre-aligner as determined by the pre-aligner.

$$W_2+L_2-P_{21}+C_2+D$$

The movement of the wafer is defined by the following:

$$H_{21}=P_{11}+C_1-P_{21}-C_2-D$$

$$H_{21}=W_1+L_1-W_2-L_2$$

FIGS. 15A and 15B depict a method of determining a z position. FIG. 15A is a top plan view showing a pin 230L and an end effector 360L. The end effector 360L includes a first protruding member 372L and a second protruding member 374L. A through-beam sensor 380L including a light emitter that emits a light beam 390L and a light receiver is provided on the first protruding member 372L and a second protruding member 374L as discussed above with respect to the various embodiments. FIG. 15B is a side view of the pin 230L and the end effector 360L shown in FIG. 15A.

Once the pin 230L is located in the x-y planar space as discussed above, a z position of the pin 230L and an environment 114L (which can include a known surface of the work station or a mounting surface upon which the robot is mounted) can be identified by the through-beam sensor 380L by traditional mapping as shown in FIGS. 15A and 15B in which the end effector 360L is positioned in the x-y plane such that the through-beam sensor 380L senses the pin 230L, and then the end effector is raised in the z direction until the through-beam sensor 380L no longer senses the pin 230L and such data is stored.

Figure 16:
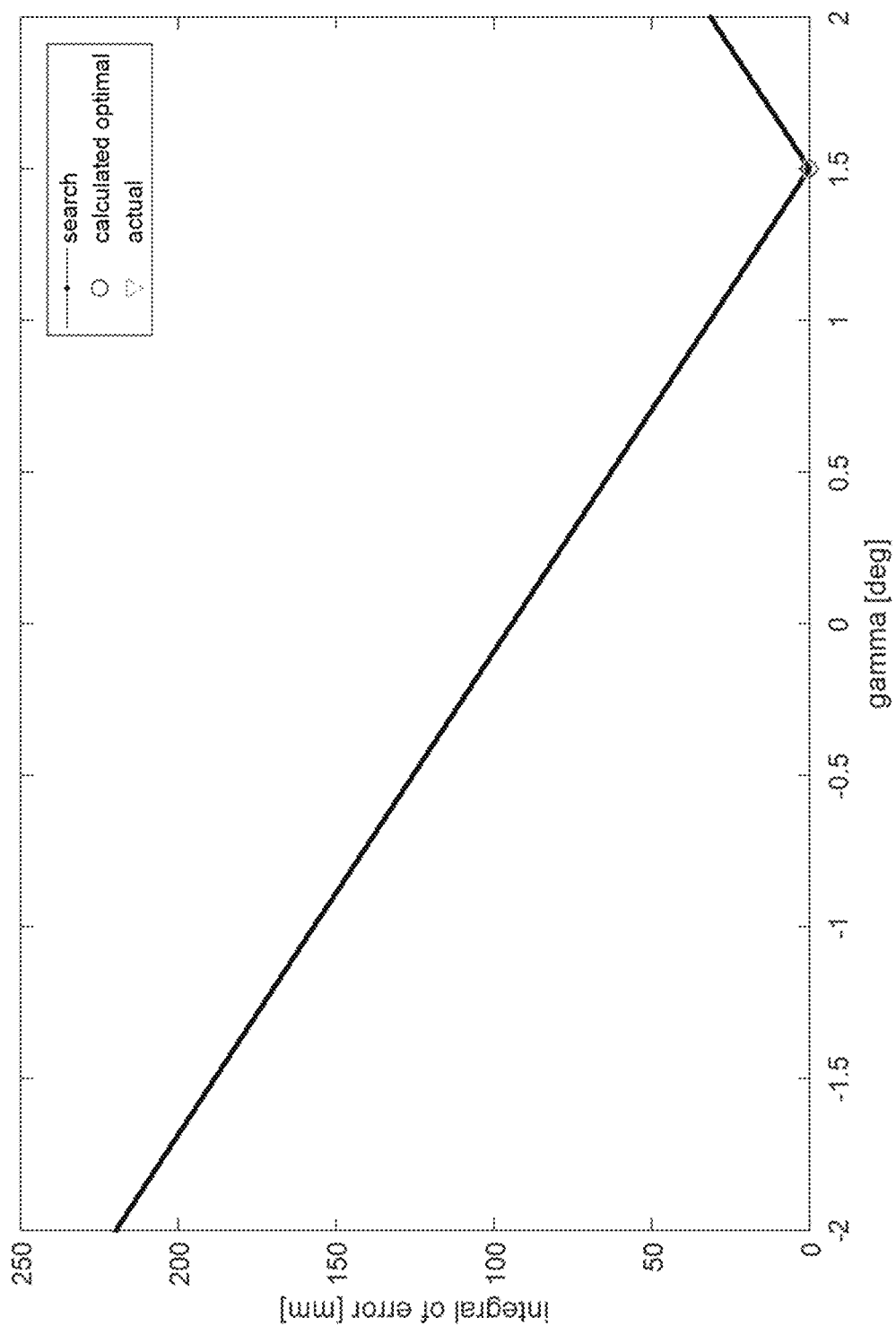
FIG. 16 is a chart showing results of a beta search numerical simulation.

A beta search numerical simulation was performed and the results are shown in FIG. 16. In the beta search numerical simulation, we artificially impose a gamma (γ) of 1.5 deg and a delta_b (δb) of 1 mm. We artificially produce one hundred and eight (108) points of data as if they were collected by the robot and use the algorithm to back out Px, Py, R, delta_b, and gamma, in the manner shown below:

```
clear
clc
Px_actual=125/1000;
Py_actual=300/1000;
% the exact radius
R_actual=500/1000;
% the nominal pin radius
r_nominal=15/1000;
% the radial disturbance associated with the beam and the pin
delta_b_actual=1/1000;
% the angular missalignment of the end effector
gamma_actual=1.5*pi/180;
r_actual=r_nominal+delta_b_actual;
the +/−operable distance of the emitter and receiver
L=75/1000;
theta=[ ];
l=[ ];
s=[ ];
r_s=[ ];
% create the range of the search
for S=[−1 1]
for THETA=60*pi/180:15*pi/180:135*pi/180
for L_search=[−L*0.8:15/1000:L*0.8];
  % if you want to animate the motion to the pin use the range
  % if you just want to specify the pin location
  for R_search=r_actual; % r+r_search:−0.002:r
  l=[l; L_search];
```

```
        theta=[theta; THETA];
        r_s=[r_s; R_search];
        s=[s; S];
        end
      end
    end
  end
% define the wrist vector for all points at which the I/O is tripped
% this information is essentially determined by the encoders
W_x=Px_actual+(s.*r_s-R_actual).*cos(gamma_actual+theta)+1.*cos(gamma_actual+theta-pi/2);
Wy=Py_actual+(s.*r_s-R_actual).*sin(gamma_actual+theta)+1.*sin(gamma_actual+theta-pi/2);
gamma_search=-2*pi/180:0.0001:2*pi/180;
E_best=inf;
gamma_best=NaN;
tic
for j=1:length(gamma_search)
% theta is the data we are getting back from the encoder which will not
% inherently have gamma
beta=-gamma_search(j)-theta+pi/2;
X=[sin(beta) cos(beta)-ones(length(beta),1) s];
% we only know the nominal value of r
B=Wy.*cos(beta)+W_x.*sin(beta)-s.*r_nominal;
A=inv(transpose(X)*X)*transpose(X)*B;
E=X*A-B;
Esum(j)=sum(abs(E));
if Esum(j)<E_best
E_best=Esum(j);
gamma=gamma_search(j);
P_x=A(1);
Py=A(2);
R=A(3);
delta_b=A(4);
end
end
toc
figure(2)
plot(gamma_search*180/pi,Esum*1000,'b.-', ...
gamma*180/pi,E_best*1000,'ro', ...
gamma_actual*180/pi,0,'gv')
xlabel('gamma [deg]')
ylabel('integral of error [mm]')
legend('search','calculated optimal','actual')
Px_error=(P_x-Px_actual)*1000
Py_error=(Py-Py_actual)*1000
R_error=(R-R_actual)*1000
delta_b_error=(delta_b-delta_b_actual)*1000
gamma_error=gamma*180/pi-gamma_actual*180/pi
```

Figure 17:
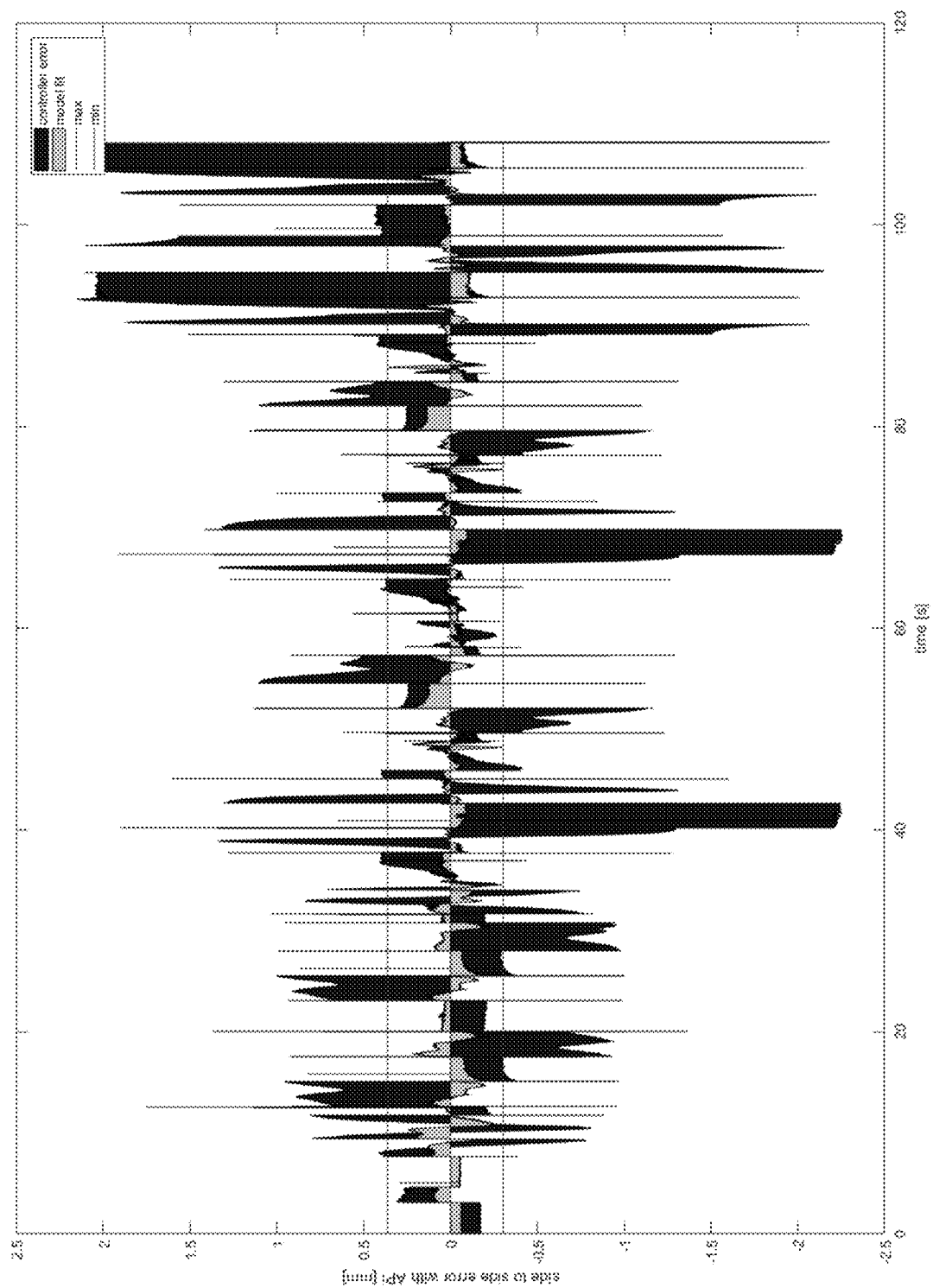
FIG. 17 is a chart showing robot accuracy/error as tested through empirical testing.
Figure 18:
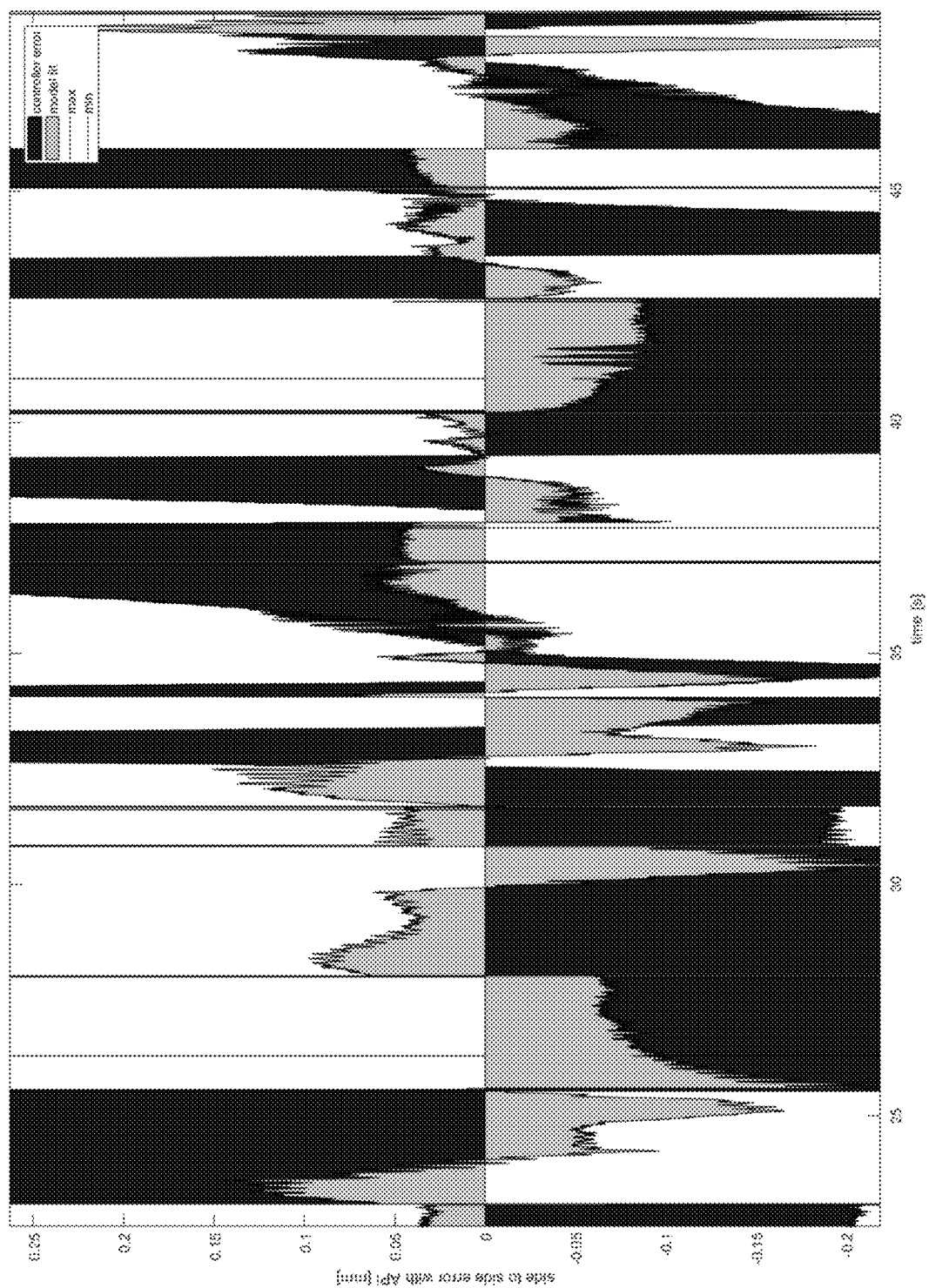
FIG. 18 is an enlarged portion of the chart in FIG. 17 showing robot accuracy/error as tested through empirical testing.

We impose a delta_b of 1 mm and a gamma of 1.5 deg. The one dimensional brute force optimization took 0.023 seconds to complete on a computer, and the results are shown in FIG. 16. We are able to calculate the following:

$Px\_error = 7.827072323607354e-12$ $Py\_error = -5.628830734849544e-11$ $R\_error = -4.544681297957709e-08$ $delta\_b\_error = -1.452637272622570e-09$ $gamma\_error = 7.721282493300397e-04$ Next robot accuracy was tested through empirical testing, and the results are shown in FIGS. 17 and 18, which both show graphs of side to side error with API in millimeters over time in seconds. (Note that FIG. 18 is an enlarged portion of the chart in FIG. 17.) The legends in FIGS. 17 and 18 each show controller error, then model fit, then max, and then min.

We placed an SMR at the center of the wrist and ran the robot through a series of motions that represent typical motion through the field of interest. Pp_homing2.m was run to extract the exact link lengths and offset angles.

```
% rotate and translate the API data so that it best fits the iec data using
% SVD
XAPI_W=jr_3D_fit([x_W y_W z_W],Xiec);
x_W=XAPI_W(:,1);
y_W=XAPI_W(:,2);
z_W=XAPI_W(:,3);
P=x_W+y_W*i;
X=[1+encoder(:,1)*0 . . . exp(i*(encoder(:,1))) . . . exp(i*sum(encoder(:,1:2)')') . . . exp(i*sum(encoder(:,1:3)')')];
% exp(i*sum(encoder(:,1:4)')')];
A=inv(transpose(X)*X)*transpose(X)*P;
L=abs(A);
delta_q=a tan 2(imag(A),real(A));
delta_s_1=delta_q(2); % torso adjustment
delta_s_2=delta_q(3)-delta_q(2); % shoulder adjustment
delta_s_3=delta_q(4)-delta_q(3); % elbow adjustment
% % delta_s_4=delta_q(5)-delta_q(4); % wrist adjustment
L_error=(L_40; L_1; L_2; L_31)*1000
offsets=[delta_s_1; delta_s_2; delta_s_3]*180/pi
L_error=
   1.4805
  -0.1308
   1.2454
   0.2283
offsets=
  -0.2789
   0.0432
   0.4340
```

These values of L and delta_s are implemented in the kinematics of the application code. For the purpose of testing, the same or similar motion profile should be commanded on the controller but with the adjustments in the kinematics. We should see that the API data now accurately aligns with the controller's perception of where the robot is located.

It should be noted that the exemplary embodiments depicted and described herein set forth the preferred embodiments of the present invention, and are not meant to limit the scope of the invention in any way. Numerous modifications and variations of the present invention are possible in light of the above teachings.

It should be noted that the exemplary embodiments depicted and described herein set forth preferred embodiments, and are not meant to limit the scope of the claims hereto in any way. Numerous modifications and variations are possible in light of the above teachings. It is therefore to be understood that, within the scope of the appended claims, the invention may be practiced otherwise than as specifically described herein.

What is claimed is:

1. A method of teaching an articulated robot, the method comprising:
   providing a first pin at a first location within a work station;
   providing the articulated robot in an area adjacent to the work station, the articulated robot having a coordinate system, the articulated robot having an arm and an end effector that is configured to pivot with respect to the arm, the end effector having a workpiece receiver with a first protruding member and a second protruding member, the end effector having a through-beam sensor including a light emitter provided on one of the first protruding member and the second protruding member, the through-beam sensor further including a light receiver provided on an other of the first protruding member and the second protruding member, the through-beam sensor being configured to sense when an object is present between the light emitter and the light receiver;

moving the articulated robot to perform sensing operations in which the through-beam sensor senses the first pin, the sensing operations being performed while a position and/or an orientation of the end effector are varied for each sensing of the first pin to gather sensed position and orientation data, the sensing operations are performed such that the first pin is located at different distances between the light emitter and the light receiver as the articulated robot moves the through-beam sensor across the first pin for a plurality of parallel movements of the end effector; and performing calculations on the sensed position and orientation data to determine the first location of the first pin with respect to the coordinate system of the articulated robot, wherein the plurality of parallel movements includes:
  a first movement in which the articulated robot moves the through-beam sensor in a first direction along a first path entirely across the first pin, the first pin being at a first distance between the light emitter and the light receiver when the through-beam sensor is moved along the first path across the first pin;
  a second movement in which the articulated robot moves the through-beam sensor in a second direction along the first path entirely across the first pin, the second direction being opposite to the first direction such that the second movement is a reverse movement to the first movement; and
  a third movement in which the articulated robot moves the through-beam sensor in a third direction along a second path entirely across the first pin, the second path being parallel to the first path, the first pin being at a second distance between the light emitter and the light receiver when the through-beam sensor is moved along the second path across the first pin, the second distance being different from the first distance.

2. The method according to claim 1,
wherein the end effector is configured to pivot with respect to the arm about a pivot axis, and
wherein the method further comprises performing calculations on the sensed position and orientation data to determine a distance extending in a direction normal to a light beam of the light emitter to the pivot axis, and an angle of the direction normal to the light beam with respect to the coordinate system of the articulated robot including an angular error of the end effector.

3. The method according to claim 1, further comprising:
providing an optical target on a pivot axis of the end effector that is configured to pivot with respect to the arm;
providing a scanning device at a fixed position with respect to the coordinate system of the articulated robot;
using the scanning device to measure positional data of the optical target as the articulated robot is moved through a range of motion; and
performing a regression analysis on the positional data to determine link lengths of links of the robot arm.

4. The method according to claim 3, further comprising:
storing the link lengths on respective encoders of motors for rotating the links of the robot arm.

5. The method according to claim 1,
wherein the work station has a work location at a predetermined position and orientation with respect to the first location of the first pin, and
wherein the method further comprises using the first location of the first pin to determine the work location with respect to the coordinate system of the articulated robot.

6. The method according to claim 5,
wherein the work location overlaps the first location of the first pin in a horizontal plane.

7. The method according to claim 1,
wherein the articulated robot includes:
  a base mounted in the area adjacent to the work station;
  the arm includes:
    a first arm member pivotally mounted to the base about a first pivot axis;
    a second arm member pivotally mounted to the first arm member about a second pivot axis; and
    a third arm member pivotally mounted to the second arm member about a third pivot axis; and
  the end effector is pivotally mounted to the third arm member about a fourth pivot axis.

8. The method according to claim 1,
wherein sensing operations include:
  a first sensing operation in which the articulated robot moves the through-beam sensor in a first linear motion across the first pin with the end effector in a first orientation; and
  a second sensing operation in which the articulated robot moves the through-beam sensor in a second linear motion across the first pin with the end effector in the first orientation, and
wherein the first linear motion and the second linear motion constitute the plurality of parallel movements of the end effector.

9. The method according to claim 8,
wherein, in the first sensing operation, the first pin is a first distance between the light emitter and the light receiver when the through-beam sensor is moved across the first pin, and
wherein, in the second sensing operation, the first pin is a second distance between the light emitter and the light receiver when the through-beam sensor is moved across the first pin, the second distance being different from the first distance.

10. The method according to claim 8,
wherein sensing operations include:
  a third sensing operation in which the articulated robot moves the through-beam sensor in a third linear motion across the first pin with the end effector in a second orientation, the second orientation being different than the first orientation; and
  a fourth sensing operation in which the articulated robot moves the through-beam sensor in a fourth linear motion across the first pin with the end effector in the second orientation, wherein the third linear motion and the fourth linear motion are parallel linear movements of the end effector, and wherein the third linear motion and the fourth linear motion are non-parallel to the first linear motion and the second linear motion.

11. The method according to claim 1,
wherein the moving of the articulated robot to perform the sensing operations includes:
  initially moving the end effector to a predetermined approximate location of the first pin; and
  moving the end effector in an area around the predetermined approximate location of the first pin until the through-beam sensor senses the first pin.

12. The method according to claim 1, the method further comprising:
  providing a second pin at a second location within a work station;
  moving the articulated robot to perform further sensing operations in which the through-beam sensor senses the second pin, the further sensing operations being performed while the position and/or the orientation of the end effector are varied for each sensing of the second pin to gather further sensed position and orientation data, the further sensing operations are performed such that the second pin is located at different distances between the light emitter and the light receiver as the articulated robot moves the through-beam sensor across the second pin; and
  performing calculations on the further sensed position and orientation data to determine the second location of the second pin with respect to the coordinate system of the articulated robot.

13. The method according to claim 12,
wherein the work station has a work location at a predetermined position and orientation with respect to the first location of the first pin and the second location of the second pin, and
wherein the method further comprises using the first location of the first pin and the second location of the second pin to determine the work location with respect to the coordinate system of the articulated robot.

14. The method according to claim 1,
wherein the articulated robot is moved to perform twenty or more sensing operations, and
wherein the performing of calculations on the sensed position and orientation data includes performing a regression analysis on the sensed position and orientation data.

15. The method according to claim 14,
wherein the performing of calculations on the sensed position and orientation data includes performing a least squares approximation and a numerical search on the sensed position and orientation data to determine the first location of the first pin with respect to the coordinate system of the articulated robot.

16. The method according to claim 1,
wherein the sensing operations are performed by both:
  moving the end effector away from the first pin such that the through-beam sensor moves across the first pin in a first direction; and
  moving the end effector toward the first pin such that the through-beam sensor moves across the first pin in a second direction opposite to the first direction, and
wherein the method further comprises using the sensed position and orientation data obtained by moving the end effector away from the first pin and moving the end effector toward the first pin to determine hysteresis error in the through-beam sensor.

17. The method according to claim 1, wherein the plurality of parallel movements are a plurality of parallel linear movements of the end effector.

18. An articulated robot comprising:
  an arm;
  an end effector that is configured to pivot with respect to the arm, the end effector having a workpiece receiver with a first protruding member and a second protruding member;
  a through-beam sensor provided on the end effector, the through-beam sensor including a light emitter provided on one of the first protruding member and the second protruding member, the through-beam sensor further including a light receiver provided on an other of the first protruding member and the second protruding member, the through-beam sensor being configured to sense when an object is present between the light emitter and the light receiver; and
  a controller including at least one processor defining a coordinate system for the articulated robot, the at least one processor being configured to control one or more motors of the articulated robot to move the arm and the end effector to perform sensing operations in which the through-beam sensor senses a first pin provided at a first location within a work station, the sensing operations being performed while a position and/or an orientation of the end effector are varied for each sensing of the first pin to gather sensed position and orientation data, the sensing operations are performed such that the first pin is located at different distances between the light emitter and the light receiver as the articulated robot moves the through-beam sensor across the first pin for a plurality of parallel movements of the end effector, the at least one processor being configured to perform calculations on the sensed position and orientation data to determine the first location of the first pin with respect to the coordinate system of the articulated robot,
  wherein the plurality of parallel movements includes:
    a first movement in which the articulated robot moves the through-beam sensor in a first direction along a first path entirely across the first pin, the first pin being at a first distance between the light emitter and the light receiver when the through-beam sensor is moved along the first path across the first pin;
    a second movement in which the articulated robot moves the through-beam sensor in a second direction along the first path entirely across the first pin, the second direction being opposite to the first direction such that the second movement is a reverse movement to the first movement; and
    a third movement in which the articulated robot moves the through-beam sensor in a third direction along a second path entirely across the first pin, the second path being parallel to the first path, the first pin being at a second distance between the light emitter and the light receiver when the through-beam sensor is moved along the second path across the first pin, the second distance being different from the first distance.

19. The articulated robot according to claim 18,
wherein the end effector is configured to pivot with respect to the arm about a pivot axis, and
wherein the at least one processor is further configured to perform calculations on the sensed position and orientation data to determine a distance extending in a direction normal to a light beam of the light emitter to the pivot axis, and an angle of the direction normal to the light beam with respect to the coordinate system of the articulated robot including an angular error of the end effector.

20. The articulated robot according to claim 18, further comprising:
an optical target provided on a pivot axis of the end effector that is configured to pivot with respect to the arm; and
a scanning device at a fixed position with respect to the coordinate system of the articulated robot, the scanning device being configured to measure positional data of the optical target as the articulated robot is moved through a range of motion,
wherein the at least one processor is further configured to perform a regression analysis on the positional data to determine link lengths of links of the robot arm.

21. The articulated robot according to claim 20, wherein the link lengths are stored on respective encoders of the one or more motors for rotating the links of the robot arm.

22. The articulated robot according to claim 18, further comprising:
a base mounted in the area adjacent to the work station, wherein the arm includes:
a first arm member pivotally mounted to the base about a first pivot axis;
a second arm member pivotally mounted to the first arm member about a second pivot axis; and
a third arm member pivotally mounted to the second arm member about a third pivot axis, and
wherein the end effector is pivotally mounted to the third arm member about a fourth pivot axis.

23. The articulated robot according to claim 18,
wherein the at least one processor is configured to control the one or more motors of the articulated robot to move the articulated robot to perform:
a first sensing operation in which the through-beam sensor is moved in a first linear motion across the first pin with the end effector in a first orientation; and
a second sensing operation in which the through-beam sensor is moved in a second linear motion across the first pin with the end effector in the first orientation,
wherein, in the first sensing operation, the first pin is a first distance between the light emitter and the light receiver when the through-beam sensor is moved across the first pin,
wherein, in the second sensing operation, the first pin is a second distance between the light emitter and the light receiver when the through-beam sensor is moved across the first pin, the second distance being different from the first distance, and
wherein the first linear motion and the second linear motion constitute the plurality of parallel movements of the end effector.

24. The articulated robot according to claim 18,
wherein the at least one processor is configured to control the one or more motors of the articulated robot to move the articulated robot to perform:
a first sensing operation in which the through-beam sensor is moved in a first linear motion across the first pin with the end effector in a first orientation; and
a second sensing operation in which the through-beam sensor is moved in a second linear motion across the first pin with the end effector in the first orientation,
a third sensing operation in which the through-beam sensor is moved in a third linear motion across the first pin with the end effector in a second orientation, the second orientation being different than the first orientation; and
a fourth sensing operation in which the through-beam sensor is moved in a fourth linear motion across the first pin with the end effector in the second orientation,
wherein the first linear motion and the second linear motion constitute the plurality of parallel movements of the end effector,
wherein the third linear motion and the fourth linear motion are parallel linear movements of the end effector, and
wherein the third linear motion and the fourth linear motion are non-parallel to the first linear motion and the second linear motion.

25. The articulated robot according to claim 18,
wherein the at least one processor is configured to control the one or more motors of the articulated robot to move the arm and the end effector to perform further sensing operations in which the through-beam sensor senses a second pin provided at a second location within the work station, the further sensing operations being performed while the position and/or the orientation of the end effector are varied for each sensing of the second pin to gather further sensed position and orientation data, the further sensing operations are performed such that the second pin is located at different distances between the light emitter and the light receiver as the articulated robot moves the through-beam sensor across the second pin, the at least one processor being configured to perform calculations on the further sensed position and orientation data to determine the second location of the second pin with respect to the coordinate system of the articulated robot, the at least one processor being configured to use the first location of the first pin and the second location of the second pin to determine the work location with respect to the coordinate system of the articulated robot.

26. The articulated robot according to claim 18,
wherein the at least one processor being configured to control one or more motors of the articulated robot to move the arm and the end effector to perform twenty or more sensing operations, and
wherein the at least one processor being configured to perform a regression analysis on the sensed position and orientation data.

27. The articulated robot according to claim 26,
wherein the at least one processor being configured to perform a least squares approximation and a numerical search on the sensed position and orientation data to determine the first location of the first pin with respect to the coordinate system of the articulated robot.

28. The articulated robot according to claim 18,
wherein the at least one processor is configured to control the one or more motors of the articulated robot to move the arm and the end effector to perform the sensing operations by both:
moving the end effector away from the first pin such that the through-beam sensor moves across the first pin in a first direction; and moving the end effector toward the first pin such that the through-beam sensor moves across the first pin in a second direction opposite to the first direction, and wherein the at least one processor is configured to use the sensed position and orientation data obtained by moving the end effector away from the first pin and moving the end effector toward the first pin to determine hysteresis error in the through-beam sensor.

29. The articulated robot according to claim 18, wherein the plurality of parallel movements are a plurality of parallel linear movements of the end effector.

30. A non-transitory computer readable medium storing a program which, when executed by one or more processors, cause the one or more processors to:

define a coordinate system for an articulated robot, the articulated robot including:
an arm;
an end effector that is configured to pivot with respect to the arm, the end effector having a workpiece receiver with a first protruding member and a second protruding member; and
a through-beam sensor provided on the end effector, the through-beam sensor including a light emitter provided on one of the first protruding member and the second protruding member, the through-beam sensor further including a light receiver provided on an other of the first protruding member and the second protruding member, the through-beam sensor being configured to sense when an object is present between the light emitter and the light receiver;

control one or more motors of the articulated robot to move the arm and the end effector to perform sensing operations in which the through-beam sensor senses a first pin provided at a first location within a work station, the sensing operations being performed while a position and/or an orientation of the end effector are varied for each sensing of the first pin to gather sensed position and orientation data, the sensing operations are performed such that the first pin is located at different distances between the light emitter and the light receiver as the articulated robot moves the through-beam sensor across the first pin for a plurality of parallel movements of the end effector; and perform calculations on the sensed position and orientation data to determine the first location of the first pin with respect to the coordinate system of the articulated robot, wherein the plurality of parallel movements includes:
a first movement in which the articulated robot moves the through-beam sensor in a first direction along a first path entirely across the first pin, the first pin being at a first distance between the light emitter and the light receiver when the through-beam sensor is moved along the first path across the first pin;
a second movement in which the articulated robot moves the through-beam sensor in a second direction along the first path entirely across the first pin, the second direction being opposite to the first direction such that the second movement is a reverse movement to the first movement; and
a third movement in which the articulated robot moves the through-beam sensor in a third direction along a second path entirely across the first pin, the second path being parallel to the first path, the first pin being at a second distance between the light emitter and the light receiver when the through-beam sensor is moved along the second path across the first pin, the second distance being different from the first distance.

31. The non-transitory computer readable medium storing a program according to claim 30,
wherein the end effector is configured to pivot with respect to the arm about a pivot axis, and
wherein the one or more processors are caused to perform calculations on the sensed position and orientation data to determine a distance extending in a direction normal to a light beam of the light emitter to the pivot axis, and an angle of the direction normal to the light beam with respect to the coordinate system of the articulated robot including an angular error of the end effector.

32. The non-transitory computer readable medium storing a program according to claim 30,
wherein an optical target is provided on a pivot axis of the end effector that is configured to pivot with respect to the arm,
wherein a scanning device is provided at a fixed position with respect to the coordinate system of the articulated robot, the scanning device being configured to measure positional data of the optical target as the articulated robot is moved through a range of motion, and
wherein the one or more processors are caused to perform a regression analysis on the positional data to determine link lengths of links of the robot arm.

33. The non-transitory computer readable medium storing a program according to claim 32, wherein the link lengths are stored on respective encoders of the one or more motors for rotating the links of the robot arm.

34. The non-transitory computer readable medium storing a program according to claim 30,
wherein the one or more processors are caused to control one or more motors of the articulated robot to move the arm and the end effector to perform twenty or more sensing operations, and
wherein the one or more processors are caused to perform a regression analysis on the sensed position and orientation data.

35. The non-transitory computer readable medium storing a program according to claim 30, wherein the plurality of parallel movements are a plurality of parallel linear movements of the end effector.

* * * * *